United States Patent
Kamei

(10) Patent No.: US 7,170,330 B2
(45) Date of Patent: Jan. 30, 2007

(54) HYSTERESIS COMPARATOR CIRCUIT

(75) Inventor: Syunji Kamei, Nagoya (JP)

(73) Assignee: Denso Corporation, Kariya (JP)

( * ) Notice: Subject to any disclaimer, the term of this patent is extended or adjusted under 35 U.S.C. 154(b) by 51 days.

(21) Appl. No.: 11/043,233

(22) Filed: Jan. 27, 2005

(65) Prior Publication Data

US 2005/0162207 A1    Jul. 28, 2005

(30) Foreign Application Priority Data

Jan. 27, 2004    (JP)    ............................. 2004-018393

(51) Int. Cl.
*H03K 3/286*    (2006.01)

(52) U.S. Cl. .................. 327/205; 327/206; 327/63; 327/65; 327/67

(58) Field of Classification Search .................. None
See application file for complete search history.

(56) References Cited

U.S. PATENT DOCUMENTS

| | | | |
|---|---|---|---|
| 4,922,132 A | * | 5/1990 | Horvitz et al. .................. 327/73 |
| 5,959,437 A | * | 9/1999 | Hamaguchi .................. 320/134 |
| 6,462,591 B2 | * | 10/2002 | Garrett et al. ............... 327/112 |
| 6,979,984 B2 | * | 12/2005 | Perrier et al. ................ 323/281 |
| 7,038,522 B2 | * | 5/2006 | Fauh et al. .................. 327/407 |
| 2005/0040878 A1 | * | 2/2005 | Garrett et al. .............. 327/333 |

FOREIGN PATENT DOCUMENTS

JP    A-2003-8408    1/2003
JP    A-2003-179468    6/2003

* cited by examiner

*Primary Examiner*—Tuan T. Lam
*Assistant Examiner*—Hiep Nguyen
(74) *Attorney, Agent, or Firm*—Posz Law Group, PLC

(57) ABSTRACT

An input voltage is applied to an inverting input terminal of a comparator having no hysteresis. A first constant voltage is divided by resistors to create a reference voltage. The reference voltage is applied to a non-inverting input terminal of the comparator through a resistor. Only while an output voltage of the comparator is a low level, a predetermined constant current is supplied to a supply point of the reference voltage and a constant current of the same magnitude is absorbed from the non-inverting input terminal of the comparator.

12 Claims, 14 Drawing Sheets

HYSTERESIS COMPARATOR CIRCUIT

CROSS REFERENCE TO RELATED APPLICATION

This application is based on and incorporates herein by reference Japanese Patent Application No. 2004-18393 filed on Jan. 27, 2004.

FIELD OF THE INVENTION

The present invention relates to a comparator circuit having hysteresis, and more specifically, to a circuit that is configured to allow independent and easy setting of a threshold voltage for an input voltage at which its output is reversed and a hysteresis width.

BACKGROUND OF THE INVENTION

A comparator circuit compares an input voltage applied to its one input terminal with a reference voltage applied to its other input terminal and outputs a signal that depends on the comparison result.

In this comparator circuit, when a noise is mixed in the input voltage and the noise brings the input voltage to reach the reference voltage, the output will change frequently by that noise. In order to avoid such an unsatisfactory operation, the comparator is often provided with a hysteresis characteristic in its input and output characteristics, as disclosed in JP 2003-179468A or JP 2003-8408A.

FIG. 13 is an example of a comparator circuit (hysteresis comparator circuit) 1 that is provided with a hysteresis characteristic by adding resistors R1, R2 and R3 and a transistor Tr1 to the comparator Q1 having no hysteresis. In this hysteresis comparator circuit 1, in the case where the input voltage Vin is increased from 0V, equal to a reference potential GND, while the value of the input voltage Vin is lower than a reference voltage Vref that is set by dividing a constant voltage Vd with resistors R1 and R2, the output voltage Vout remains at a "Low" level (for example, 0V). During this period, the transistor Tr1 is in an OFF state; the input voltage of an inverting input terminal of the comparator Q1 is equal to the reference voltage Vref, whose value is given by Vd×R2/(R1+R2).

When the value of the input voltage Vin increases to the reference voltage Vref, the output voltage Vout will turn from the "Low" (L) level to the "High" (H) level (for example, 5V). The value of the input voltage when the output of the comparator turns from the L level to the H level with increasing input voltage in this way is designated as a H-side threshold VthH. The value of the H-side threshold VthH of the hysteresis comparator circuit 1 is Vd×R2/(R1+R2).

When the transistor Tr1 becomes an ON state, the value of the reference voltage Vref will be Vd×R2×R3/(R1×R2+R2×R3+R3×R1), assuming that an ON resistance of the transistor Tr1 is low. Conversely, in the case where the value of the input voltage Vin is decreased from a sufficiently high value, when the input voltage Vin becomes lower than the reference voltage Vref at the time of the ON state of this transistor Tr1, the output voltage Vout of the comparator Q1 will turn from the H level to the L level.

The value of the input voltage when the output of the comparator turns from the H level to the L level in the case where the input voltage Vin is decreased from a sufficiently high voltage in this way is designated as a L-side threshold VthL. The value of the L-side threshold VthL of the hysteresis comparator circuit 1 is equal to the reference voltage Vref when the transistor Tr1 described above is in the ON state and the value is smaller than the H-side threshold VthH.

From the above operations, the input-output characteristic of the hysteresis comparator circuit 1 becomes the one shown in FIG. 15. The difference [VthH−VthL] between the two input voltages at which the output turns from the H level to the L level and vice versa, respectively, is the hysteresis width.

Since the hysteresis comparator circuit 1 shown in FIG. 13 performs operations described above, the H-side threshold VthH, the L-side threshold VthL, and the hysteresis width that is a difference between the two thresholds can be set to desired values by adjusting the resistances of the resistors R1, R2 and R3, provided that the value of the constant voltage Vd is determined in advance.

The hysteresis comparator circuit 1 is a circuit used in the case where the input voltage Vin is designed to be converted to a binary signal by comparing it with the reference voltage Vref. However, there is a case where the magnitude of the input voltage Vin is designed to be determined by comparing it with two or more reference voltages Vref2, Vref3 and the like. In such a case, it is possible to perform the determination by providing a necessary number of the hysteresis comparator circuits 1 shown in FIG. 13 independently and adjusting the reference voltages of the circuits to be Vref2, Vref3 and the like.

However, as many voltage divider circuits, each including the resistors R1 and R2, as the number of circuits are needed in such a case. As a result, a load current of a constant voltage source for supplying the constant voltage Vd increases. In order to prevent it, enlarging the resistances of the resistors R1 and R2 is conceivable. However, in that case, the area of a pattern increases in implementing the circuit in an IC, and further introduces inconvenience that the accuracy of each resistance becomes worse.

As another measure, for example in the case of converting the input voltage into three values, it is also possible to create two reference voltages Vref2 and Vref3 with one voltage divider circuit including three resistors R4, R5 and R6 as shown in FIG. 14, prepare two hysteresis comparator circuits 2 and 3 that use them as reference voltages, and make determination. When such a configuration is adopted, only one voltage divider circuit can do even in the case where further more reference voltages are required; therefore, it is not necessary to increase the load current of the voltage source for supplying the constant voltage Vd.

However, in the case of the two hysteresis comparator circuits shown in this FIG. 14, when the input voltage Vin increases from 0V to exceed the reference voltage Vref2 that is the H-side threshold VthH of the hysteresis comparator circuit 2, the transistor Tr2 will turn to the ON state, and a current will flow in the resistor R7. Then, the value of the reference voltage Vref3 will change from the value determined by a voltage division ratio by the resistors R4, R5 and R6.

This indicates that, in the case where the value of the H-side threshold VthH of the hysteresis comparator circuit 3 is designed to be set to a desired value, it is insufficient to consider only the resistances of the resistors R4, R5 and R6, and the resistance of the resistor R7 used in the hysteresis comparator circuit 2 connected in parallel must be considered as well. The same applies to setting of the L-side threshold VthL of the hysteresis comparator circuit 3 and setting of the L-side threshold VthL of the hysteresis comparator circuit 2.

Thus, assuming that the resistances of resistors in other hysteresis comparator circuit connected to a common voltage divider circuit must also be considered when setting the values of the H-side threshold VthH and the L-side threshold VthL, adjustment of the resistances of voltage dividing resistors will be extremely complicated. Its complexity increases remarkably as hysteresis comparator circuits connected to the common voltage divider circuit increase in number.

Moreover, according to this method, when there occurs a need to alter a threshold voltage of any one of hysteresis comparator circuits after the resistances of the voltage dividing resistors are determined, the resistances of all the voltage dividing resistors need be adjusted again.

SUMMARY OF THE INVENTION

The present invention is made in order to solve such technical insufficiency of the prior art. The object of the present invention is to provide a hysteresis comparator circuit that can create a plurality of reference voltages necessary for a plurality of hysteresis comparator circuits and allow independent and easy setting of a H-side threshold VthH and a L-side threshold VthH and a hysteresis width that is a difference of these thresholds, even in a case where a plurality of hysteresis comparator circuits are needed in order to convert an input voltage into a multi-level value.

The hysteresis comparator of this invention is constructed so that an input impedance of a comparator when considered from the side of an interconnection point of two resistors for voltage division may become infinite. For this reason, when the value of a constant voltage applied to the voltage dividing resistors is determined in advance, a value of a H-side threshold VthH can be set to a desired value only by adjusting resistances of the voltage dividing resistors without considering circuit constants other than the resistances of these voltage dividing resistors.

Moreover, the hysteresis width can be set to a desired value only by adjusting the resistance of another resistor and current values of first and second constant current source circuits without considering the resistances of the voltage dividing resistors. Thus, the H-side threshold VthH, the hysteresis width, and accordingly the L-side threshold VthL can easily be set independently.

BRIEF DESCRIPTION OF THE DRAWINGS

The above and other objects, features and advantages of the present invention will become more apparent from the following detailed description made with reference to the accompanying drawings.

DETAILED DESCRIPTION OF THE PREFERRED EMBODIMENTS

[First Embodiment]

Figure 1:
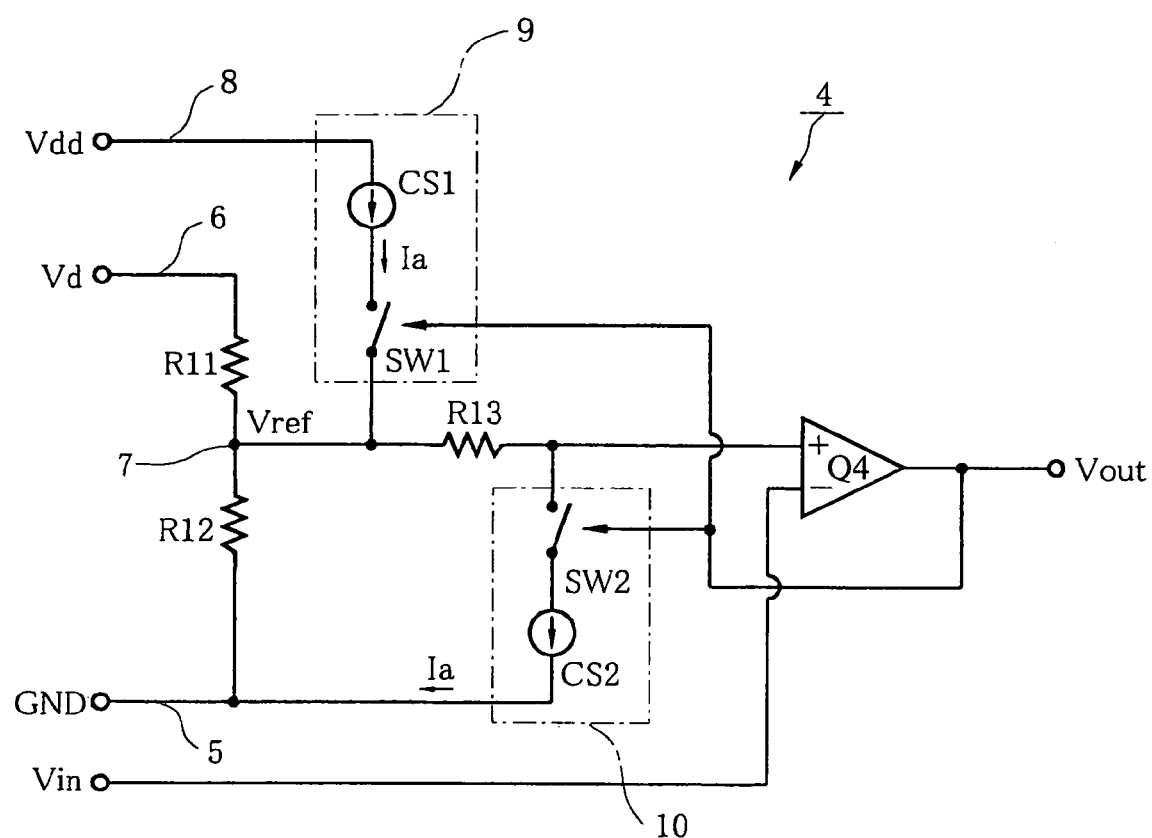
FIG. 1 is a hysteresis comparator circuit according to a first embodiment of the present invention.

As shown in FIG. 1, a hysteresis comparator circuit 4 of a first embodiment is constructed with a comparator Q4, a resistor (first resistor) R11, a resistor (second resistor) R12, a resistor (third resistor) R13, a first constant current circuit 9 and a second constant current circuit 10.

The resistors R11 and R12 are connected in series between a potential reference line 5 connected to the reference potential GND (ground) and a first power line 6 for supplying a first constant voltage Vd applied from the outside, with the resistor R11 connected to the first power line 6. The resistor R13 is connected between the interconnection point 7 of the resistors R11 and R12 and a non-inverting input terminal (+) of the comparator Q4. An input voltage Vin is applied to the inverting input terminal (−) of the comparator Q4.

The comparator Q4 outputs a H-level voltage (for example, 5V) when a voltage applied to the non-inverting input terminal is equal to or more than a voltage applied to the inverting input terminal, and outputs a L-level voltage (for example, 0V) when the above condition is not satisfied. The comparator Q4 is a comparator having no hysteresis and very high input impedance. In the description below, the comparator Q4 will be treated as a comparator with infinite input impedance.

The first constant current source circuit 9 is connected between the interconnection point 7 and a second power line 8 for supplying a second constant voltage Vdd. The first constant current source circuit 9 includes a constant current source CS1 and an analog switch SW1. Only while the output voltage Vout of the comparator Q4 is the L level, the analog switch SW1 becomes conductive, which enables a constant current Ia outputted by the constant current source CS1 to be supplied to the interconnection point 7.

A second constant current source circuit 10 is connected between the non-inverting input terminal of the comparator Q4 and the potential reference line 5. The second constant current source circuit 10 includes a series circuit of a constant current source CS2 and an analog switch SW2. Only while the output voltage Vout of the comparator Q4 is the L level, the analog switch SW2 becomes conductive, which allows the constant current source CS2 to absorb the constant current Ia from the non-inverting input terminal. The constant currents supplied (or absorbed) by the constant current source CS1 and the constant current source CS2 are an equal value Ia.

Next, operations of the hysteresis comparator circuit 4 of FIG. 1 configured in this way will be described. First, a case where the value of an input voltage Vin is increased from 0V equal to the reference potential GND will be described. When the input voltage Vin is sufficiently low, the output voltage Vout of the comparator Q4 is the H level. At this time, since both of the analog switches SW1 and SW2 are in the OFF state, no current is supplied to the interconnection point 7 and no current is absorbed from the non-inverting input terminal either. A current flowing in the resistor R13 is zero, and the input impedance of the comparator Q4 when considered from the side of the interconnection point 7 is infinite.

In this state, the input voltage Vin supplied to the non-inverting input terminal of the comparator Q4 is equal to the voltage of the interconnection point 7. The voltage value is a constant value calculated by dividing the first constant voltage Vd by the resistors R11 and R12, i.e., Vd×R12/(R11+R12). Hereinafter, this voltage value will be defined as a reference voltage Vref. The above operation state continues immediately before the value of the input voltage increases to reach the reference voltage Vref.

When the input voltage Vin increases to exceed the reference voltage Vref even slightly, the output voltage Vout of the comparator Q4 will turn from the H level to the L level. Then, both of the analog switches SW1 and SW2 will turn to the ON state. The constant current Ia will be supplied to the interconnection point 7 from the first constant current source circuit 9. The constant current Ia will be absorbed by the second constant current source circuit 10 from the non-inverting input terminal of the comparator Q4. The constant current Ia flows in the resistor R13 toward the non-inverting input terminal.

In this state, since all of the constant current Ia supplied from the first constant current source circuit 9 will be absorbed by the second constant current source circuit 10 through the resistor R13, no change will occur in the current flowing in the resistors R11 and R12. Therefore, no change occurs in the voltage of the interconnection point 7, the voltage remaining at the reference voltage Vref. The input impedance of the comparator Q4 when considered from the side of the interconnection point 7 remains infinite.

While the output voltage Vout of the comparator Q4 is the L level, the applied voltage to the non-inverting input terminal is a constant value, [Vref−R13×Ia]. When the value of the input voltage Vin exceeds the reference voltage Vref and after that, as long as the input voltage Vin exceeds this constant value [Vref−R13×Ia] even slightly, the output voltage Vout remains at the L level.

Next, operations in the case where the input voltage Vin is decreased from a high voltage will be described. When the input voltage Vin is sufficiently high, the output voltage Vout is the L level, the analog switches SW1 and SW2 are in the ON state. Accordingly the input voltage supplied to the non-inverting input terminal has become [Vref−R13×Ia]. When the input voltage Vin decreases to be lower than [Vref−R13×Ia] even slightly, the output voltage Vout will turn from the L level to the H level. Then, the analog switches SW1 and SW2 will turn to the OFF state, and the input voltage supplied to the non-inverting input terminal will return to the reference voltage Vref. After that, as long as the voltage Vin is lower than this reference voltage Vref even slightly, the output voltage Vout remains at the H level.

Figure 15:
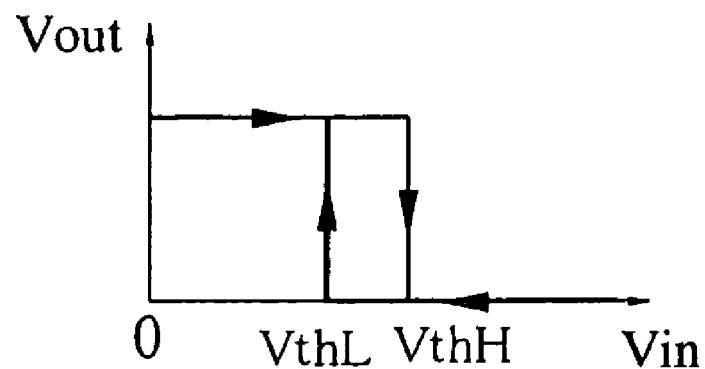
FIG. 15 is an input-output characteristic diagram of the hysteresis comparator circuit according to the prior art.

Summarizing the above operations, a relationship between the input voltage Vin and the output voltage Vout of the hysteresis comparator circuit 4 shown in FIG. 1 becomes the one shown in FIG. 15, which indicates that it operates as a comparator having hysteresis. The voltage at the interconnection point 7 remains at the reference voltage Vref, regardless of whether the output voltage Vout of the comparator Q4 is the H level or the L level. The input impedance of the comparator Q4 when considered from the side of the interconnection point 7 is always infinite, regardless of the level of the output voltage Vout. The value of the H-side threshold VthH is equal to Vd×R12/(R11+R12) that is the reference voltage Vref, and the value of the L-side threshold VthL is [Vref−R13×Ia]. The hysteresis width is R13×Ia.

Since the H-side threshold VthH becomes the reference voltage Vref, in the case where the value of the first constant voltage Vd is determined in advance, the value of the H-side threshold VthH can be set to a desired value only by adjusting the resistances of the resistors R11 and R12 without considering circuit constants other than the resistors R11 and R12.

Since the hysteresis width can be calculated by an expression of R13×Ia, it can be set to a desired value only by adjusting the resistance of the resistor R13 and the current values Ia of the first and second constant current source circuits 9 and 10 without considering the resistances of the resistors R11 and R12. Thus, the hysteresis comparator circuit 4 of this embodiment achieves an advantage that the H-side threshold VthH and the hysteresis width. Accordingly the value of the L-side threshold VthL can easily be set independently.

Figure 14:
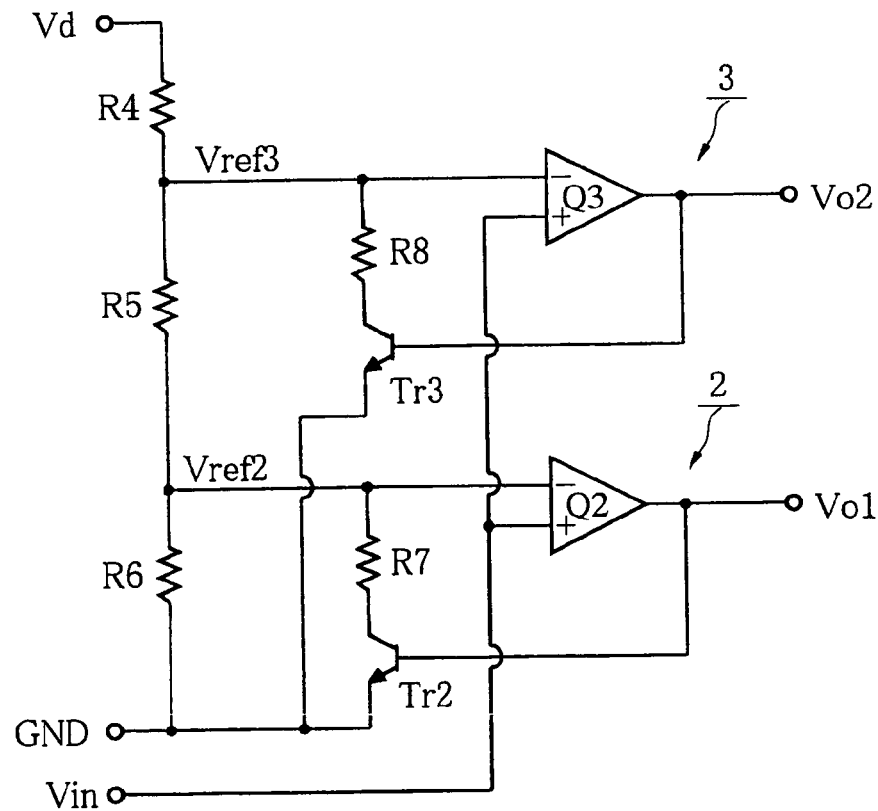
FIG. 14 is a hysteresis comparator circuit according to another prior art.

Moreover, since the input impedance of the comparator Q4 when considered from the side of the interconnection point 7 becomes always infinite, construction of a circuit using a plurality of comparators as in FIG. 14. That is, assuming that a circuit part of the comparator Q4 side from the interconnection point 7 in FIG. 1 is used for a circuit part of the comparator side from the interconnection point that gives the reference voltages Vref2 and Vref3 in FIG. 14, the values of the reference voltages Vref2 and Vref3, namely the H-side thresholds VthH of the hysteresis comparator circuits 2 and 3 can easily be set to a desired value only by adjusting the resistors R4, R5, and R6. Furthermore, this embodiment has an advantage that each hysteresis width can also be set without considering the resistances of the resistors R4, R5 and R6.

[Second Embodiment]

Figure 16:
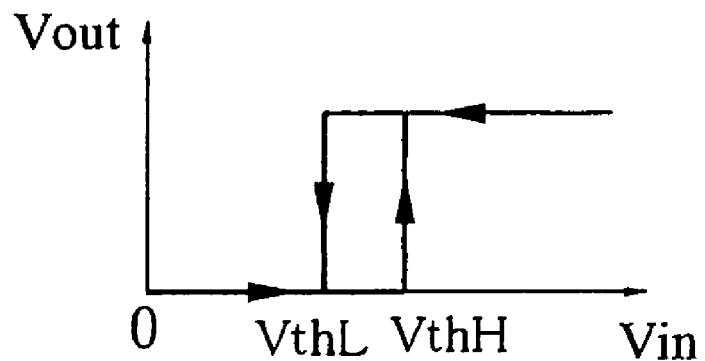
FIG. 16 is another input-output characteristic diagram of the hysteresis comparator circuit.

A hysteresis comparator circuit 4a of a second embodiment realizes a hysteresis comparator circuit having an input-output characteristic as shown in FIG. 16.

The circuit configuration of FIG. 2 differs from the circuit configuration of FIG. 1 in the following respects. A connection of one end of the resistor (third resistor) 13 is changed from a connection with the non-inverting input terminal of the comparator Q4 to a connection with the inverting input terminal. The input voltage Vin is applied to the non-inverting input terminal of the comparator Q4, not to the inverting input terminal. The constant current Ia supplied by the first constant current source circuit 9 is supplied to the inverting input terminal of the comparator Q4, not to the interconnection point 7.

A connection of the second constant current source circuit 10 is changed so as to allow the second constant current source circuit 10 to absorb the constant current Ia from the interconnection point 7. The values of the constant currents outputted by the constant current source CS1 and by the constant current source CS2 are equal. Points at which the analog switches SW1 and SW2 turn to the ON state when the output voltage Vout of the comparator Q4 is the L level are the same as in the case of FIG. 1.

In this configuration, a case where the value of the input voltage Vin is increased from 0V that is equal to the reference potential GND will be described. When the input voltage Vin is sufficiently low, the output voltage Vout of the comparator Q4 becomes the L level, and both of the analog switches SW1 and SW2 are in the ON state. In this state, the constant current Ia supplied from the first constant current source circuit 9 is absorbed by the constant current source circuit 10 after flowing in the resistor R13. At this time, the input voltage supplied to the inverting input terminal of the comparator Q4 has become [Vref+R13×Ia]. Moreover, the input impedance of the comparator Q4 when considered from the side of the interconnection point 7 is infinite.

While the input voltage Vin is equal to or lower than [Vref+R13×Ia], the output voltage Vout remains at the L level. When the input voltage Vin exceeds [Vref+R13×Ia] even slightly, the output voltage Vout will turn from the L level to the H level. Then, the analog switches SW1 and SW2 will turn to the OFF state, and the input voltage supplied to the inverting input terminal will decrease to the reference voltage Vref. After that, as long as the input voltage Vin exceeds the reference voltage Vref even slightly, the output voltage Vout remains at the H level. In this state, the input impedance of the comparator Q4 when considered from the side of the interconnection point 7 is also infinite.

When the input voltage Vin is decreased from the value at which the output voltage Vout is maintained at the H level, at a point when the input voltage Vin becomes lower than the reference voltage even slightly, the output voltage Vout will turn from the H level to the L level. The analog switches SW1 and SW2 are turned to the ON state, and the input voltage supplied to the inverting input terminal increases to [Vref+R13×Ia].

Summarizing these operations, the input-output characteristic of the hysteresis comparator circuit 4a of this embodiment becomes the one shown in FIG. 16. The voltage of the interconnection point 7 remains at the reference voltage Vref regardless of whether the output voltage Vout of the comparator Q4 is the H level or the L level. The input impedance of the comparator Q4 when considered from the side of the interconnection point 7 is always infinite, regardless of the level of the output voltage Vout. The value of the H-side threshold VthH is equal to [Vref+R13×Ia], and the value of the L-side threshold VthL is equal to the reference voltage Vref. The hysteresis width becomes R13×Ia, as in the case of FIG. 1.

Thus, in the case of this embodiment, the L-side threshold VthL is determined only by the resistors R11 and R12 and the voltage Vd, and the hysteresis width is determined only by the resistor R13 and the constant current Ia. Therefore, these values can easily be set independently as in the case of the first embodiment.

Moreover, as in the case of the circuit configuration of the first embodiment, this embodiment achieves an advantage that the construction of a circuit using a plurality of comparators as in FIG. 14 is simplified.

[Third Embodiment]

Figure 3:
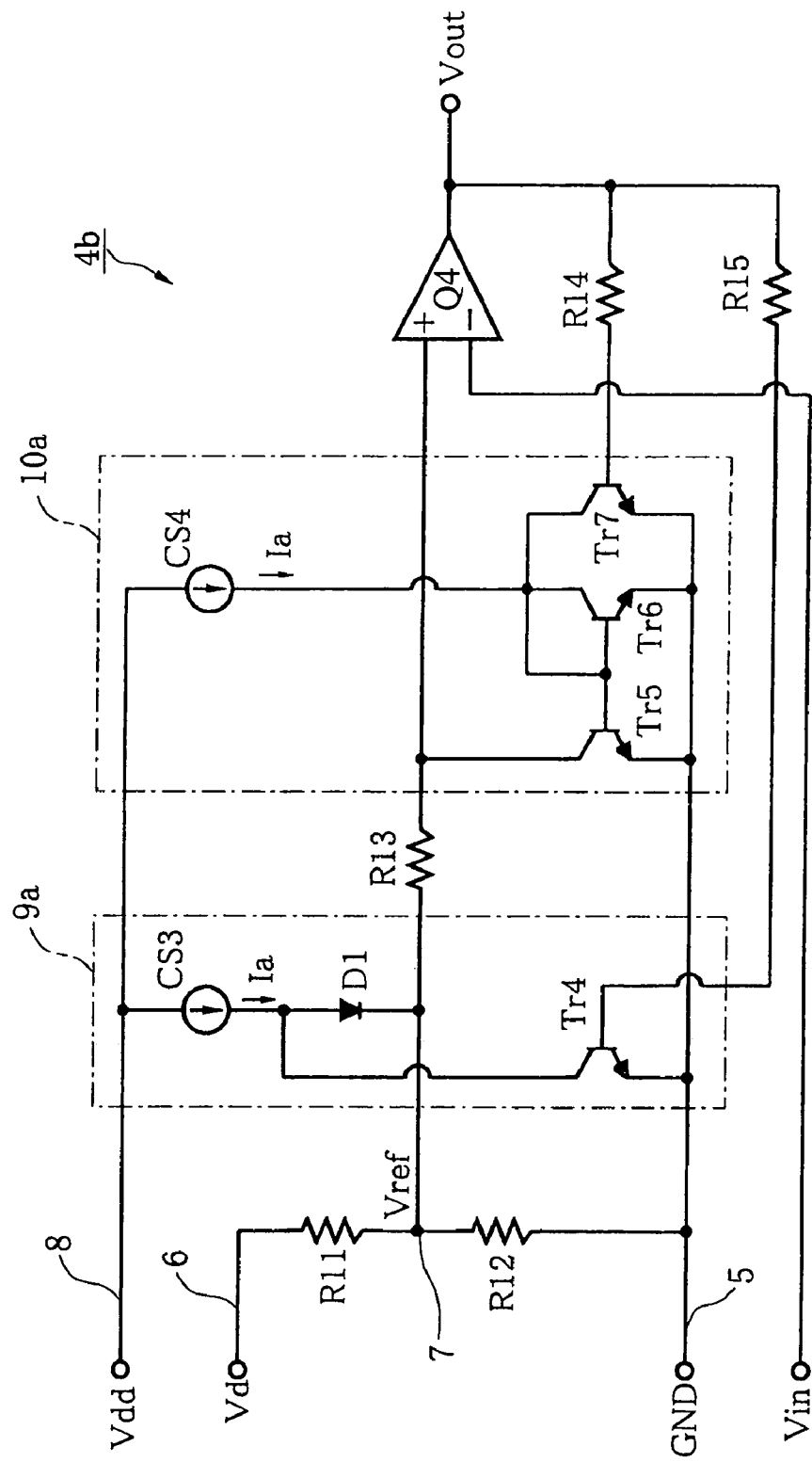
FIG. 3 is a hysteresis comparator circuit according to a third embodiment of the present invention.

A hysteresis comparator circuit 4b of a third embodiment is a circuit such that the first constant current source circuit 9 and the second constant current source circuit 10 in FIG. 1 (first embodiment) are replaced with constant current source circuits 9a and 10a shown in FIG. 3, respectively.

The constant current source circuit 9a is constructed with a first constant current source CS3, a diode D1 and a transistor (first NPN transistor) Tr4. The first constant current source CS3 and the diode D1 are connected in series between the second power line 8 and the interconnection point 7, with the first constant current source CS3 connected to the second power line 8, and with a cathode of the diode D1 connected to the interconnection point 7. The transistor Tr4 is connected between an anode of the diode D1 and the potential reference line 5.

A resistor R15 is connected between a base of the transistor Tr4 and an output terminal of the comparator Q4. While the output voltage Vout of the comparator Q4 is the H level, the transistors Tr4 is being turned to the ON state by a current flowing in the resistor R15. All of the constant current Ia outputted from the first constant current source CS3 flows in the potential reference line 5 through the transistor Tr4. Therefore, no current is supplied to the interconnection point 7.

When the output voltage Vout of the comparator Q4 turns to the L level, the transistor Tr4 will turn to the OFF state. Consequently the constant current Ia outputted from the first constant current source CS3 will be supplied to the interconnection point 7 through the diode D1. That is, only while the output voltage Vout-of the comparator Q4 is the L level, the constant current Ia is supplied to the interconnection point 7 by the first constant current source CS3. Thus, the constant current source circuit 9a performs the same operations as those of the first constant current source circuit 9 in FIG. 1.

The other constant current source circuit 10a is constructed with a second constant current source CS4, a transistor (second NPN transistor) Tr5, a transistor (third NPN transistor) Tr6 and a transistor (fourth NPN transistor) Tr7. The second constant current source CS4 and the transistor Tr6 are connected in series between the second power line 8 and the potential reference line 5, with the second constant current source CS4 connected to the second power line 8. The transistor Tr5 is connected between the non-inverting input terminal of the comparator Q4 and the potential reference line 5.

Both bases of the transistors Tr5 and Tr6 are connected to a collector of the transistor Tr6 to constitute a current mirror circuit. The transistors Tr5 and Tr6 are formed so that their electric characteristics are identical and the current amplification factor may become a large value. Therefore, equal currents flow into their collectors. The transistor Tr7 is connected in parallel with the transistor Tr6, and a resistor R14 is connected between its base and the output terminal of the comparator Q4.

While the output voltage Vout of the comparator Q4 is the H level, a current flowing in the resistor R14 is keeping the transistor Tr7 in the ON state. At this time, all of the constant current Ia outputted by the second constant current source CS4 flows in the potential reference line 5 through the transistor Tr7. Since no current flows in the transistor Tr6, the collector current of the transistor Tr5 also becomes zero. No current is absorbed from the non-inverting input terminal of the comparator Q4.

When the output voltage Vout of the comparator Q4 turns to the L level, the transistor Tr7 will turn to the OFF state. Consequently the constant current Ia outputted from the second constant current source CS4 will flow in the potential reference line 5 through the transistor Tr6. At this time, the constant current Ia equal to the collector current of the transistor Tr6 flows in the transistor Tr5 by the current mirror operation.

The constant current Ia is absorbed from the non-inverting input terminal of the comparator Q4. That is, only while the output voltage Vout of the comparator Q4 is the L level, the constant current Ia is absorbed from the non-inverting input terminal of the comparator Q4 by the second constant current source CS4. Thus, the constant current source circuit 10a performs the same operations as those of the second constant current source circuit 10 in FIG. 1.

As described above, the constant current source circuits 9a and 10a in FIG. 3 perform the same operations as those of the first constant current source circuit 9 and the second constant current source circuit 10 in FIG. 1, respectively. Therefore, the operations of the hysteresis comparator circuit 4b shown in FIG. 3 become the same as those of the hysteresis comparator circuit 4 in FIG. 1. The input-output characteristic becomes the one shown in FIG. 15, and this embodiment achieves the same advantage as the first embodiment.

[Fourth Embodiment]

Figure 2:
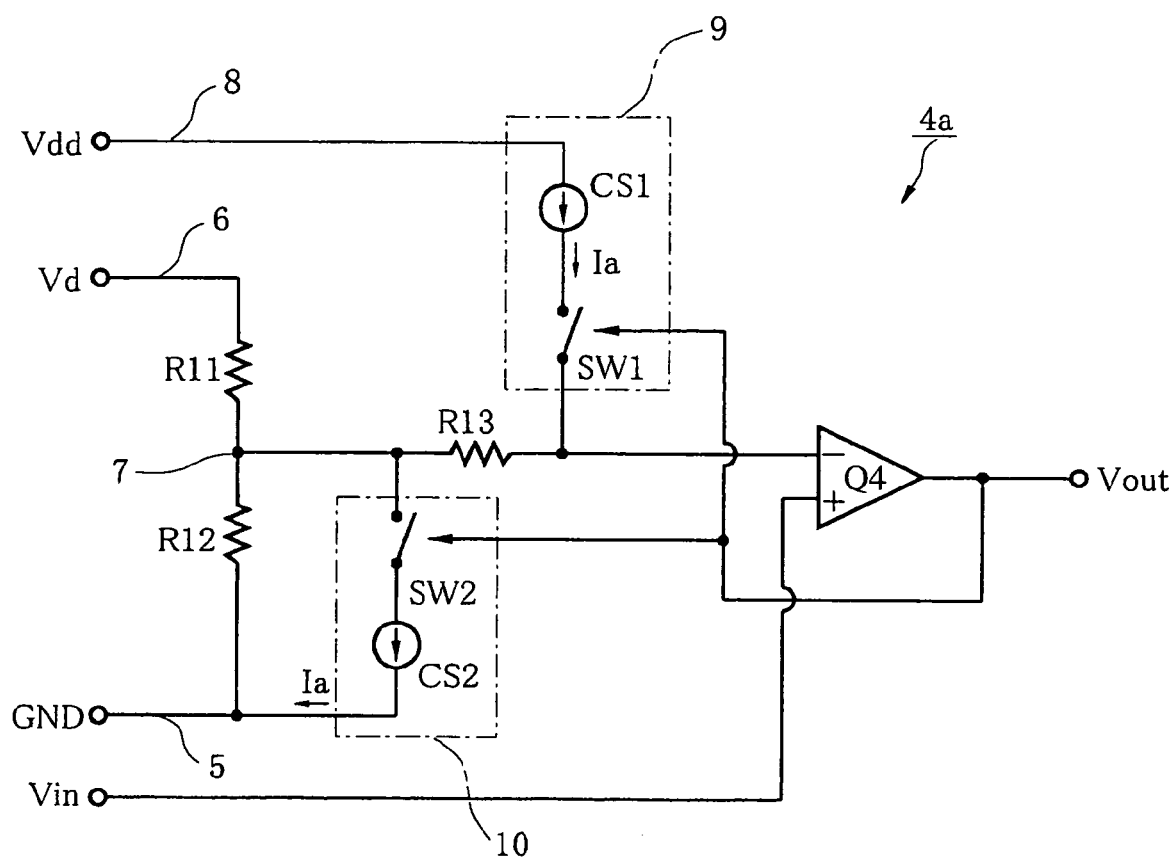
FIG. 2 is a hysteresis comparator circuit according to a second embodiment of the present invention.
Figure 4:
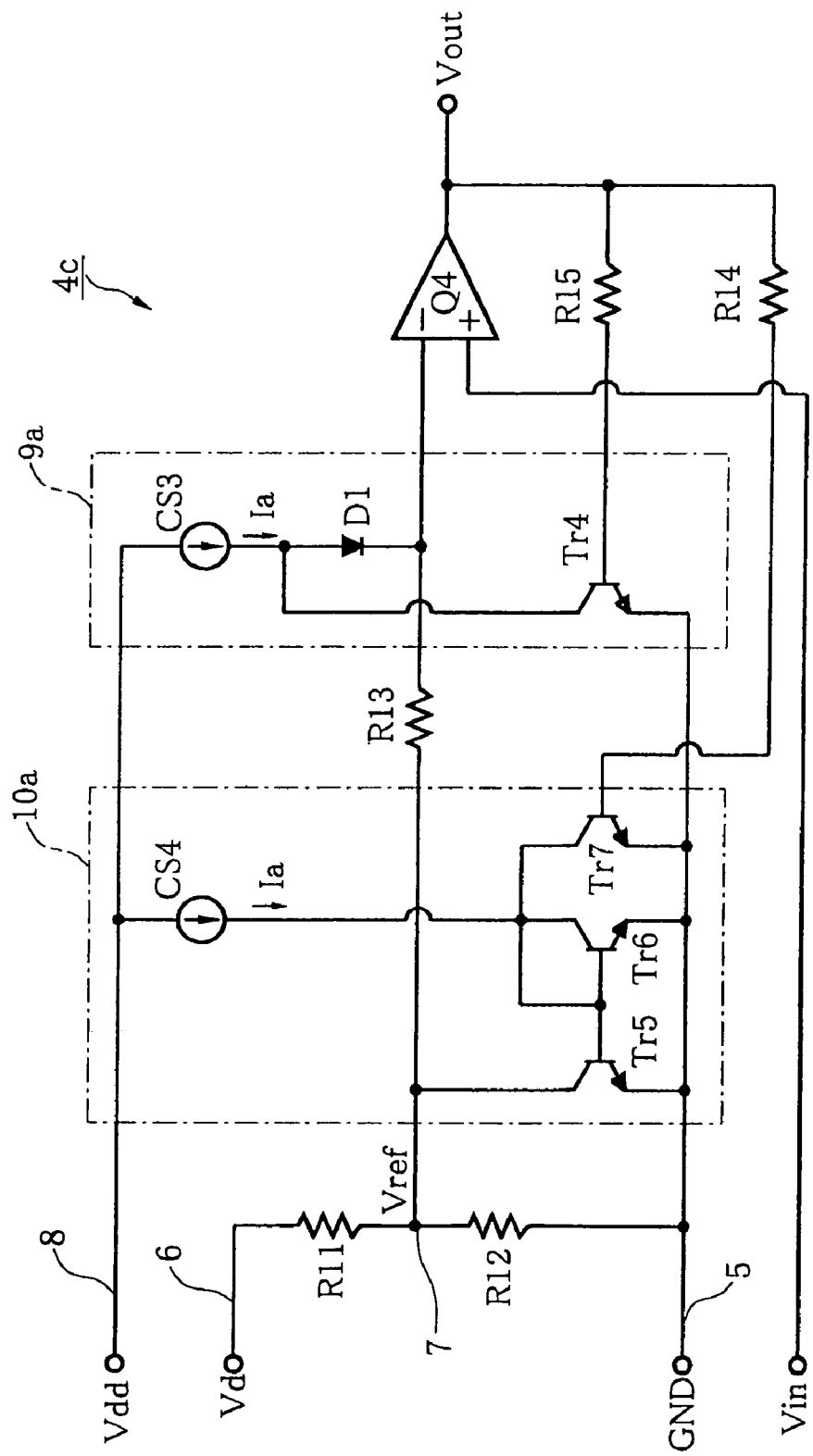
FIG. 4 is a hysteresis comparator circuit according to a fourth embodiment of the present invention.

A hysteresis comparator circuit 4c of a fourth embodiment is one such that the first constant current source circuit 9 and the second constant current source circuit 10 in FIG. 2 (second embodiment) are replaced with the constant current source circuits 9a and 10a in FIG. 4, respectively.

When the output voltage Vout of the comparator Q4 is the H level, the transistors Tr4 and Tr7 are in the ON state, and both constant currents Ia outputted by the first and second constant current sources CS3 and CS4 flow in the potential reference line 5. No current is supplied to the inverting input terminal of the comparator Q4, and no current is absorbed from the interconnection point 7.

When the output voltage Vout of the comparator Q4 changes to the L level, both of the transistors Tr4 and Tr7 will turn to the OFF state. The constant current Ia outputted by the first constant current source CS3 will be supplied to the inverting input terminal of the comparator Q4 through the diode D1.

On the other hand, the constant current Ia outputted by the second constant current source CS4 will flow in the potential reference line 5 through the transistor Tr6. At this time, the transistor Tr5 absorbs the same current Ia from the interconnection point 7 by the current mirror action.

Since the circuit operates as stated above, the operations of the hysteresis comparator circuit 4c shown in FIG. 4 become the same as those of the hysteresis comparator circuit 4a shown in FIG. 2. The input-output characteristic becomes the one shown in FIG. 16, and the circuit achieves the same advantage as was described in the second embodiment.

[Fifth Embodiment]

A hysteresis comparator circuit 4d of a fifth embodiment is an embodiment such that examples of concrete circuits realizing the first and second constant current sources CS3 and CS4 in FIG. 3 (third embodiment) are incorporated in the hysteresis comparator circuit of the third embodiment.

Figure 5:
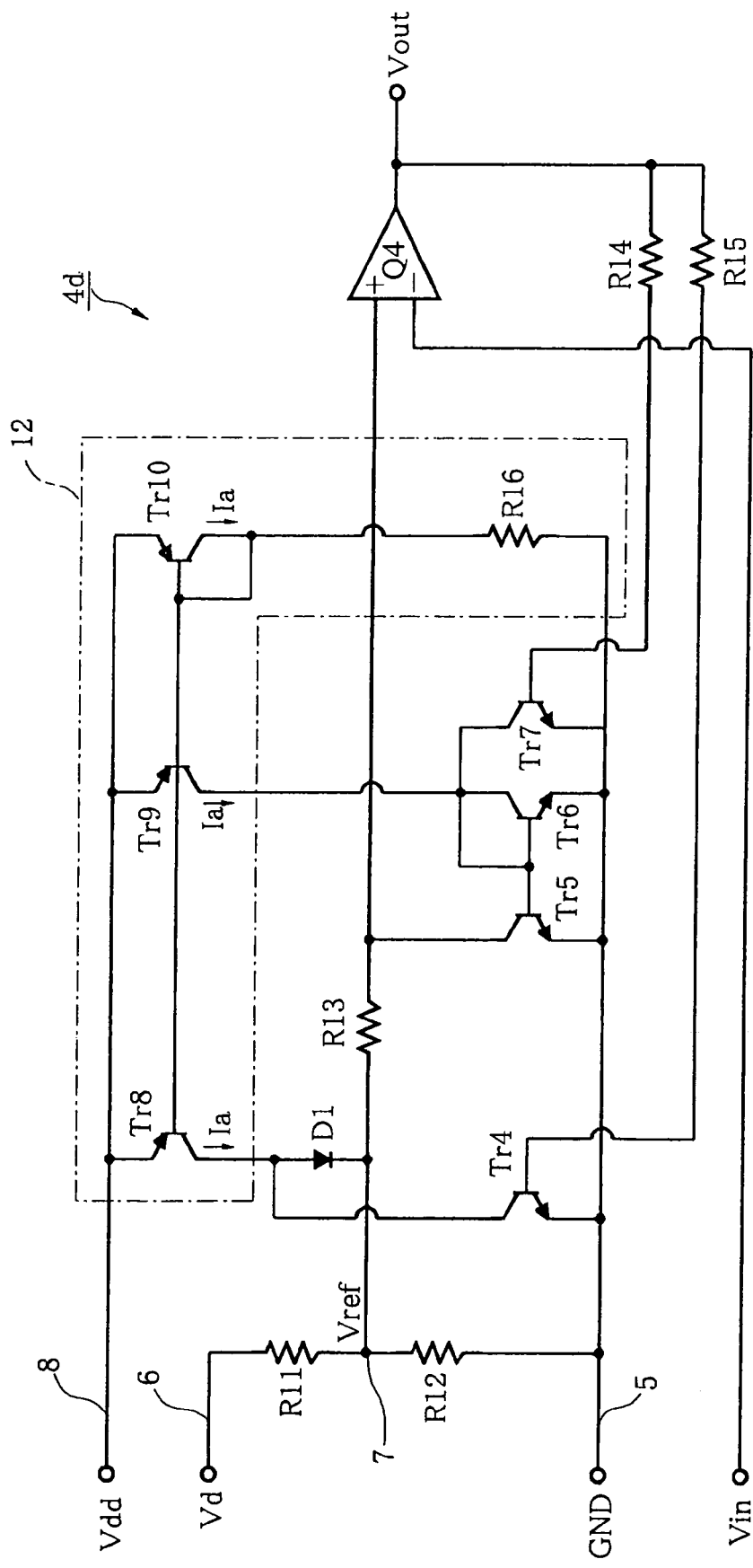
FIG. 5 is a hysteresis comparator circuit according to a fifth embodiment of the present invention.

The first and second constant current sources CS3 and CS4 are replaced with the current mirror circuits 12 shown in FIG. 5. The current mirror circuit 12 is constructed with a transistor (first PNP transistor) Tr8, a transistor (second PNP transistor) Tr9, a transistor (third PNP transistor) Tr10 and a resistor (fourth resistor) R16.

All of emitters of the transistors Tr8, Tr9 and Tr10 are connected to the second power line 8, and their bases are connected together and connected to a collector of the transistor Tr10. A collector of the transistor Tr8 is connected to the anode of the diode D1, a collector of the transistor Tr9 is connected to the collector of the transistor Tr6, and the collector of the transistor Tr10 is connected to the potential reference line 5 through the resistor R16.

In this current mirror circuit 12, the transistors Tr8, Tr9 and Tr10 are formed so that their electric characteristics are identical and the current amplification factor may become a large value. Therefore, currents of the same magnitude flow in the collectors of the respective transistors by the current mirror action.

A collector current of the transistor Tr10 becomes a constant value Ia obtained by the following calculation: a residual of subtraction of the base-emitter voltage of the transistor Tr10 from the value of the second constant voltage Vdd is divided by the resistance of the resistor R16. Therefore, the collector currents of the transistors Tr8 and Tr9 also become the constant current Ia.

Thus, the constant current Ia is always supplied to the anode of the diode D1 and the collector of the transistor Tr6. Therefore, the operations of the hysteresis comparator circuit 4d shown in FIG. 5 of this embodiment become the same as those of the hysteresis comparator circuit 3d in FIG. 3 (third embodiment). An input-output characteristic becomes the one shown in FIG. 15, as in the third embodiment, and the advantage becomes the same.

It is noted that, although the description was given assuming that the transistors Tr8, Tr9 and Tr10 have identical electric characteristics in this embodiment, as long as the Tr8 and Tr9 have the identical electric characteristics, the transistor Tr10 may differ from these transistors in cell area. In that case, the ratio of the collector currents of these transistors becomes the same as the ratio of the cell areas.

[Sixth Embodiment]

A hysteresis comparator circuit 4e of a sixth embodiment is a circuit such that the first and second constant current sources CS3 and CS4 in FIG. 4 (fourth embodiment) are replaced with the same current mirror circuits as the current mirror circuit 12 shown in FIG. 5 (fifth embodiment). The same part or a corresponding part in FIG. 6 as that in FIG. 5 is designated with the similar reference numeral and its description is not repeated.

As described in the fifth embodiment, the collectors of the transistors Tr8 and Tr9 always output the same constant currents Ia as the current flowing in the resistor R16. Therefore, the constant current Ia is always supplied to both the anode of the diode D1 and the collector of the transistor Tr6. By this operation, the operations of the hysteresis comparator circuit 4e in FIG. 6 of this embodiment become the same as those of the hysteresis comparator circuit 4c in FIG. 4 of the fourth embodiment, exhibiting the same input-output characteristic; the circuit achieves the same advantage.

[Seventh Embodiment]

Figure 7:
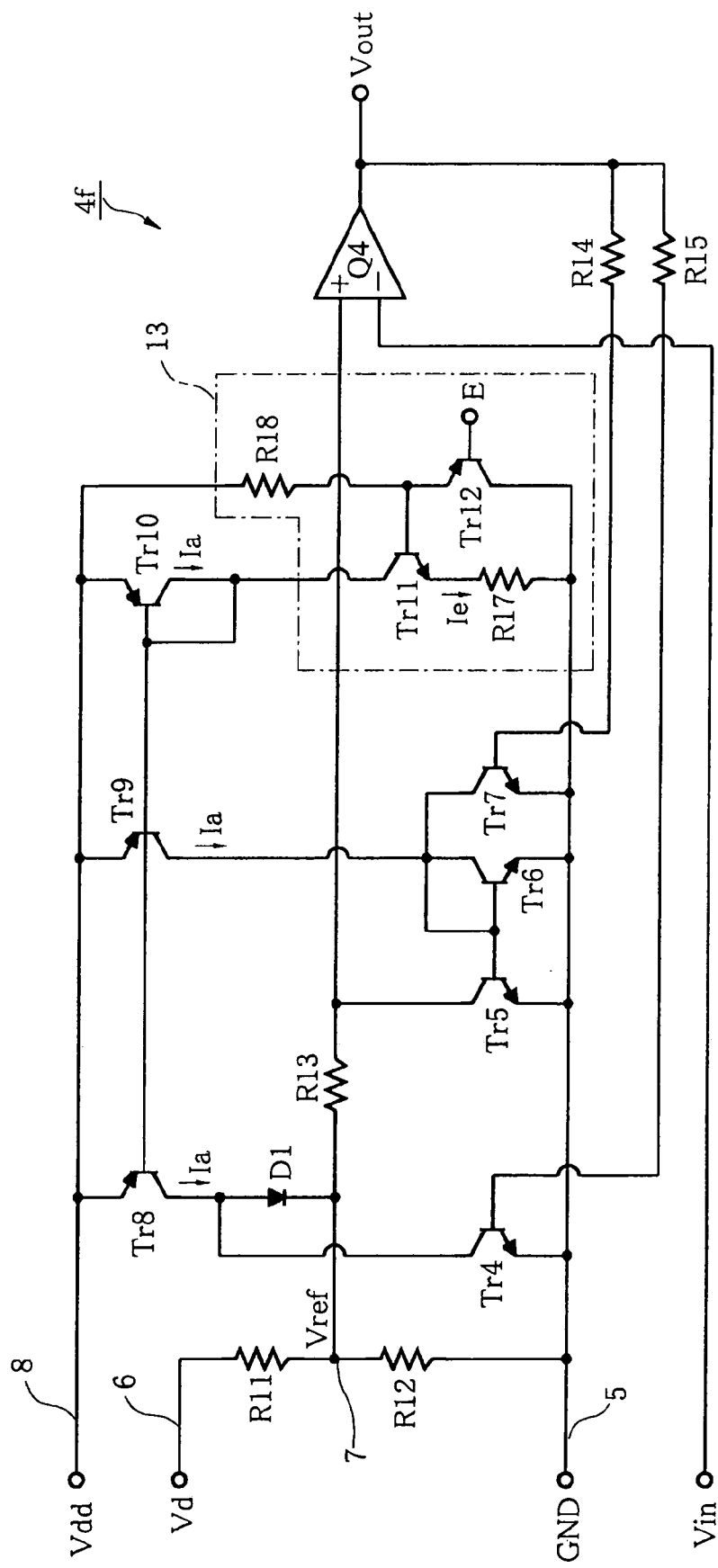
FIG. 7 is a hysteresis-comparator circuit according to a seventh embodiment of the present invention.

A hysteresis comparator circuit 4f of a seventh embodiment is a circuit such that the resistor (fourth resistor) R16 in FIG. 5 (fifth embodiment) is replaced with a constant current source circuit 13 shown in FIG. 7.

The constant current source circuit 13 is constructed with a transistor (fifth NPN transistor) Tr11, a transistor (fourth PNP transistor) Tr12, a resistor (fifth resistor) R17 and a resistor (sixth resistor) R18. A third constant voltage E is applied to a base of the transistor Tr12 by an unillustrated constant voltage source.

The transistor Tr11 and the resistor R17 are connected in series between the collector of the transistor Tr10 and the potential reference line 5, with the resistor R17 connected to the potential reference line 5. The resistor R18 is connected between the second power line 8 and the transistor Tr12. The transistor Tr12 is connected between the base of the transistor Tr12 and the potential reference line 5.

A current having flowed through the resistor R18 gives a base current of the transistor Tr11 and an emitter current of the transistor Tr12. In the case where the transistors Tr11 and Tr12 are formed so that the base-emitter voltages of the transistors Tr11 and Tr12 may become almost equal, an emitter voltage of the transistor Tr11 becomes equal to the third constant voltage E applied to the base of the transistor Tr12.

Therefore, the current flowing in the resistor R17 becomes a constant current Ie (=E/R17) given by dividing the third constant voltage E by the resistance of the resistor R17. Assuming that the current amplification factor of the transistor Tr11 is sufficiently high, the same constant current Ie also flows into its collector. That is, the constant current Ie(=E/R17) is absorbed from the interconnection point of the collector and the base of the transistor Tr10. When the current amplification factors of the transistors Tr8, Tr9 and Tr10 are sufficiently high, the values of the collector currents Ia of these transistors become equal to the constant current Ie (=E/R17).

Thus, since the collector currents of the transistors Tr8, Tr9 and Tr10 become constant, the operations of the hysteresis comparator circuit 4f shown in FIG. 7 of this embodiment become the same as those of the hysteresis comparator circuit 4d in FIG. 5 (fifth embodiment), exhibiting the same input-output characteristic; the circuit achieves the same advantage.

Moreover, in the case of the circuit configuration of this embodiment, an advantage that will be described below can be obtained as well. Representing absolute values of the base-emitter voltages of the transistors Tr11 and Tr12 by V11be and V12be, respectively, the hysteresis width of this embodiment is expressed as follows.

Hysteresis width=$Ia \times R13 = (E + V12be - V11be) \times R13/R17$

This formula indicates that, when the temperature coefficients of the base-emitter voltages of the transistors Tr11 and Tr12 are equal and the temperature coefficients of the resistors R13 and R17 are equal, the hysteresis width becomes a constant value that is not temperature-dependent.

Although the transistor Tr11 is a NPN transistor and the transistor Tr12 is a PNP transistor, differing in the type, it is not difficult to form the transistors having almost equal temperature coefficients of base-emitter voltage. The resistors R13 and R17 can also be given the same temperature coefficient by forming them on the same IC using the identical process.

In addition, the error ratios of formed resistances become almost the same in this case. Therefore, the value of R13/R17 can be made a constant value that is hardly susceptible to both a temperature change in resistances and manufacturing errors. From these reasons, in the case where the hysteresis comparator circuits 4d in FIG. 7 are formed on the same IC, it becomes easy to maintain correctly the hysteresis width calculated by the above Formula (1) to a certain value.

The same can be true about the reference voltage Vref of the interconnection point 7. That is, the value of the reference voltage Vref is also determined by the ratio of the resistors R11 and R12. Therefore, it becomes possible to maintain correctly the value of the reference voltage Vref to a certain value that is hardly susceptible to both a temperature change in the resistances of the resistors R11 and R12 and manufacturing errors by forming the resistors R11 and R12 on the same IC using the identical process.

Thus, the hysteresis comparator circuit 4f shown in FIG. 7 of this embodiment achieves an advantage that the H-side threshold VthH, the L-side threshold VthL, and the hysteresis width between them becomes hardly affected by the temperature change and becomes hardly affected by the manufacturing errors of resistors.

[Eighth Embodiment]

Figure 6:
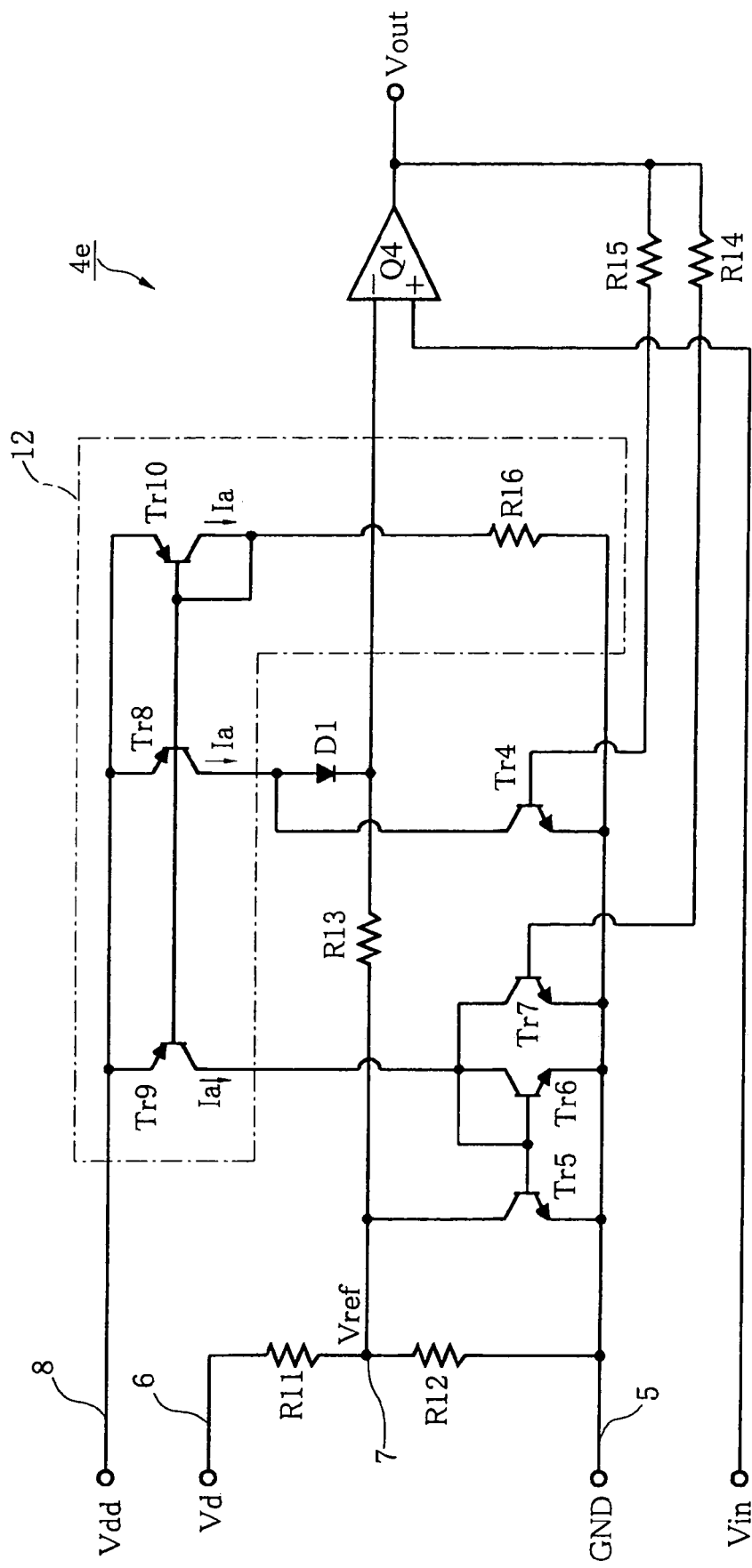
FIG. 6 is a hysteresis comparator circuit according to a sixth embodiment of the present invention.
Figure 8:
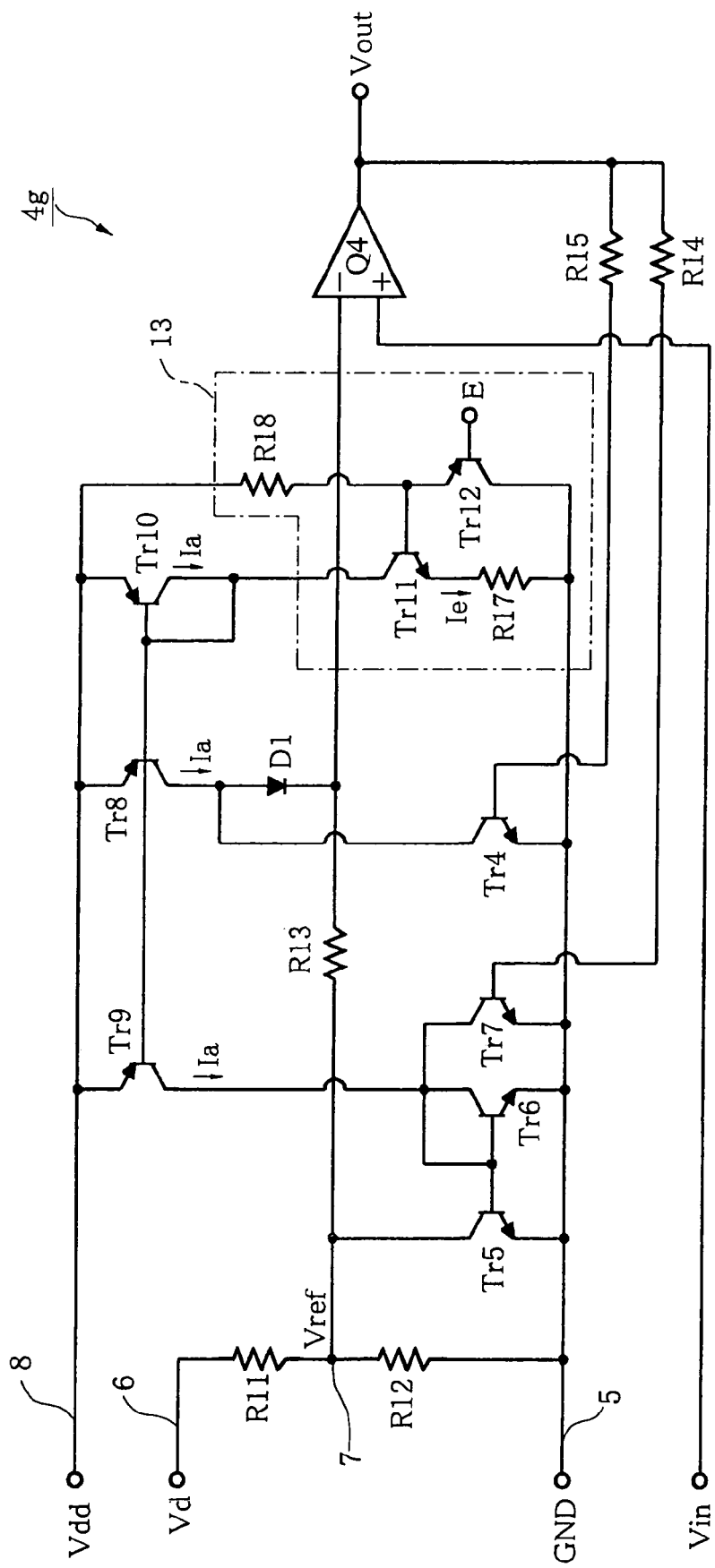
FIG. 8 is a hysteresis comparator circuit according to an eighth embodiment of the present invention.

A hysteresis comparator circuit 4g of an eighth embodiment is a circuit such that the resistor (fourth resistor) R16 in FIG. 6 (sixth embodiment) is replaced with the constant current source circuit 13 shown in FIG. 8 as in the case of the seventh embodiment.

The operation of the constant current source circuit 13 was described in respect of the seventh embodiment. Therefore, the hysteresis comparator circuit 4g of this embodiment performs the same operations as those of the hysteresis comparator circuit 4e shown in FIG. 6 (sixth embodiment). Its input-output characteristic and effect are the same as in the case of the seventh embodiment.

[Ninth Embodiment]

A hysteresis comparator circuit 4h of a ninth embodiment is constructed with a comparator Q5, a first constant current source circuit 15, a second constant current source circuit 16, a resistor (first resistor) R21, a resistor (second resistor) R22 and a resistor (third resistor) R23.

The comparator Q5, having a non-inverting input terminal (+ symbol input terminal) and an inverting input terminal (− symbol input terminal), outputs a H-level voltage (for example, 5V) when a voltage applied to the non-inverting input terminal is equal to or more than a voltage applied to the inverting input terminal. It outputs a L-level voltage (for example, 0V) when the above condition is not satisfied. This circuit is a comparator that has no hysteresis and very high input impedance. In the description below, the comparator is treated as a comparator with infinite input impedance.

The resistors R21 and R22 are connected in series between the first power line 6 for supplying the first constant voltage Vd and the potential reference line 5, with the resistor R21 connected to the first power line 6. The resistor R23 is connected between an interconnection point 17 of the resistors R21 and R22 and the non-inverting input terminal of the comparator Q5. The input voltage Vin is applied to the inverting input terminal of the comparator Q5.

The first constant current source circuit 15 is connected between the second power line 8 for supplying the second constant voltage Vdd and the non-inverting input terminal of the comparator Q5. This first constant current source circuit 15 includes a series circuit of a constant current source CS5 and an analog switch SW3. Only while the output voltage Vout of the comparator Q5 is the H level, the analog switch SW3 becomes conductive and supplies the constant current Ia outputted by the constant current source CS5 to the non-inverting input terminal of the comparator Q5.

The second constant current source circuit 16 is connected between the interconnection point 17 and the potential reference line 5. This second constant current source circuit 16 is constructed with a series circuit of a constant current source CS6 and an analog switch SW4. Only while the output voltage Vout is H level, the analog switch SW4 becomes conductive, which allows the constant current source CS6 to absorb the constant current Ia from the interconnection point 17. The value of the constant current that the constant current source CS5 flows and the value of the constant current that the constant current source CS6 absorbs are the equal value Ia.

In this circuit configuration, in the case where the value of the input voltage Vin is increased from 0V, when the input voltage Vin is sufficiently low, the output voltage Vout of the comparator Q5 is the H level; both of the analog switches SW3 and SW4 are in the ON state. In this state, the constant current Ia is supplied to the non-inverting input terminal of the comparator Q5, and the same constant current Ia is absorbed from the interconnection point 17.

Although the constant current Ia flows in the resistor R23 toward the interconnection point 17, there occurs neither a current flowing in the resistor R23 from the interconnection point 17 nor a current flowing out of the resistor R23, because all of the current is absorbed by the fourth constant current source circuit 16. That is, the input impedance of the resistor R23 plus the comparator Q5 when considered from the side of the interconnection point 17 has become infinite.

A voltage of the interconnection point 17 at this time becomes Vd×R22/(R21+R22). This voltage is called a reference voltage Vref1. The applied voltage to the non-inverting input terminal of the comparator Q5 has become [Vref1+Ia×R23]. This state continues until just before the value of the input voltage Vin reaches [Vref1+Ia×R13]. When the value of the input voltage Vin increases to exceed [Vref1+Ia×R23] even slightly, the output voltage Vout of the comparator Q5 will turn from the H level to the L level.

Then, both of the analog switches SW3 and SW4 will turn to the OFF state, and current supply to the non-inverting input terminal of the comparator Q5 and current absorbance from the interconnection point 17 will stop. The applied voltage to the non-inverting input terminal of the comparator Q5 will decrease to the reference voltage Vref1. This state continues as long as the value of the input voltage Vin exceeds the reference voltage Vref.

In the case where the input voltage decreases from a high value, when it becomes lower than the reference voltage Vref1 even slightly, the output voltage Vout of the comparator Q5 will turn from the L level to the H level. By such operations, the input-output characteristic of the hysteresis comparator circuit 4h of this embodiment becomes the one shown in FIG. 15. In the diagram, the L-side threshold VthL is equal to Vd×R22/(R21+R22) that is the reference voltage Vref1, and the H-side threshold VthH becomes [Vref1+Ia×R23], so the hysteresis width becomes Ia×R23.

Figure 13:
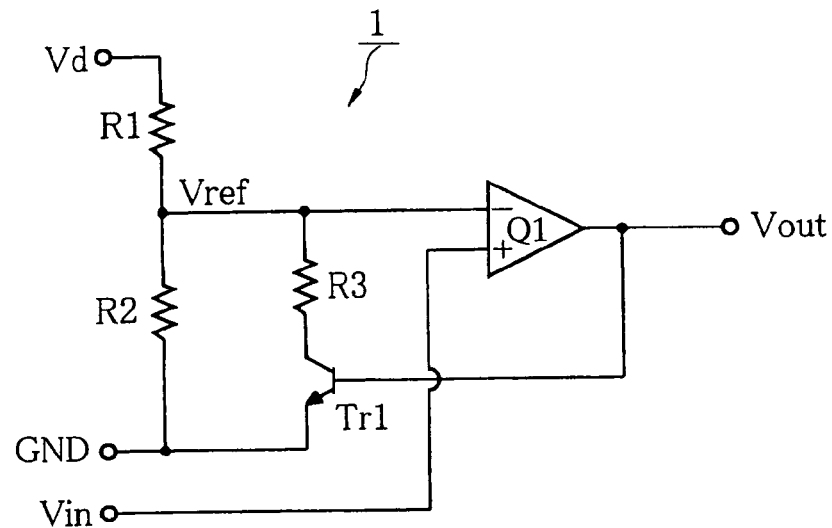
FIG. 13 is a hysteresis comparator circuit according to a prior art.

Thus, the L-side threshold VthL is determined only by the first constant voltage Vd and the resistances of the resistors R21 and R22, regardless of the constant current Ia and the resistor R23. The hysteresis width is determined by the value of the constant current Ia and the resistance of the resistor R23, regardless of the first constant voltage Vd and the resistors R21 and R22. Therefore, this embodiment achieves an advantage that the value of the H-side threshold VthH and the hysteresis width, and accordingly the L-side threshold VthL can be set easily as compared to the conventional circuit as in FIG. 13.

Moreover, since the input impedance of the comparator Q5 when considered from the side of the interconnection point 17 has become always infinite as in the case of the first embodiment, construction of a circuit that uses a plurality of comparators as in FIG. 14 becomes easy.

[Tenth Embodiment]

A hysteresis comparator circuit 4i of a tenth embodiment is designed to realize a hysteresis comparator circuit having an input-output characteristic as shown in FIG. 16.

The circuit configuration of FIG. 10 differs from the circuit configuration of FIG. 9 in the following respects. A connection of one end of the resistor (third resistor) R23 is changed from that with the non-inverting input terminal of the comparator Q5 to that with the inverting input terminal. The input voltage Vin is inputted into the non-inverting input terminal of the comparator 5, not to the inverting input terminal. The output current of the first constant current source circuit 15 is supplied to the interconnection point 17, not to the non-inverting input terminal of the comparator Q5.

A connection of the second constant current source circuit 16 is changed so as to allow the second constant current source circuit 16 to absorb the constant current Ia from the inverting input terminal of the comparator Q5. The values of the constant currents outputted by the constant current source CS5 and by the constant current source CS6 are equal. Points at which both of the analog switches SW3 and SW4 turn to the ON state when the output voltage Vout of the comparator Q5 is the H level are the same as those in the case of FIG. 9.

When increasing the value of the input voltage Vin from 0V in this configuration, while the input voltage Vin is sufficiently low, the output voltage Vout of the comparator Q5 is the L level; both of the analog switches SW3 and SW4 are in the OFF state. The voltage of the inverting input terminal of the comparator Q5 has become the reference voltage Vref1 described in the ninth embodiment.

When the input voltage Vin exceeds the reference voltage Vref1 even slightly, the output voltage Vout will turn from the L level to the H level. The analog switches SW3 and SW4 will turn to the ON state; the constant current Ia supplied from the first constant current source circuit 15 will flow in the resistor R23, and will be absorbed by the second constant current source circuit 16.

By this operation, the input voltage supplied to the inverting input terminal of the comparator Q5 reduces to [Vref1−R23×Ia]. The input impedance of the resistor R23 plus the comparator Q5 when considered from the side of the interconnection point 17 remains infinite. While the input voltage Vin exceeds [Vref−R23×Ia], the output voltage Vout is maintained at the H level.

When the input voltage Vin decreases from a high voltage to be lower than [Vref1−R23×Ia] even slightly, the output voltage Vout will turn from the H level to the L level. The analog switches SW3 and SW4 will turn to the OFF state; the input voltage supplied to the inverting input terminal will increase to the reference voltage Vref1.

By such operations, the input-output characteristic of the hysteresis comparator circuit 4i of this embodiment becomes the one shown in FIG. 16. The value of H-side threshold VthH becomes equal to the reference voltage Vref1 and the value of L-side threshold VthL becomes equal to (Vref1−R23×Ia). The hysteresis width becomes R23×Ia, as in the case of FIG. 9.

Thus, in the case of this embodiment, the H-side threshold VthH is determined only depending on the resistors R21 and R22 and the voltage Vd. The hysteresis width is determined only by the resistor R23 and the constant current Ia. Therefore, as in the case of the ninth embodiment, this embodiment achieves an advantage that the H-side threshold VthH and the hysteresis width, and accordingly the L-side threshold VthL, can be set easily compared to the conventional circuit as in FIG. 13. Moreover, since the input impedance of the comparator Q5 when considered from the side of the interconnection point 17 has become always infinite, this embodiment achieves an advantage that the construction of a circuit using a plurality of comparators as in FIG. 14 is simplified, similarly as in the ninth embodiment.

[Eleventh Embodiment]

Figure 9:
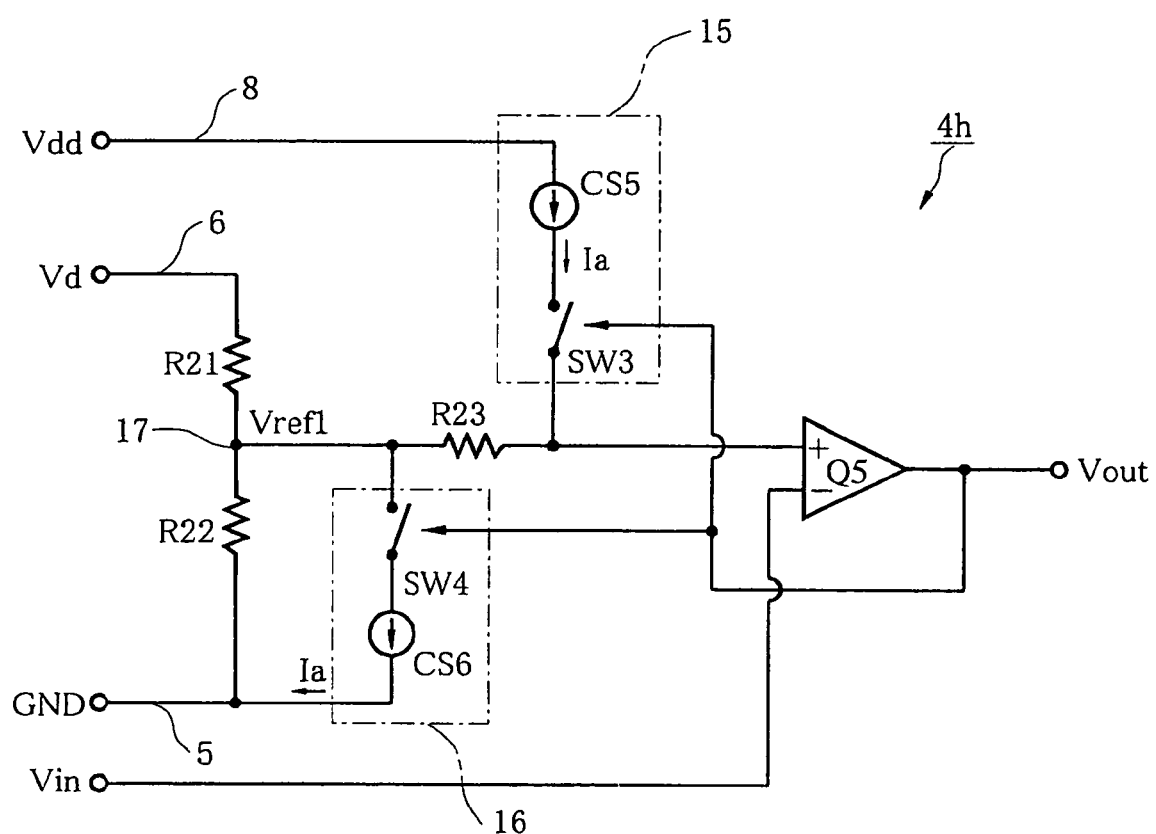
FIG. 9 is a hysteresis comparator circuit according to a ninth embodiment of the present invention.

A hysteresis comparator circuit 4j of an eleventh embodiment is an embodiment such that examples of concrete circuits realizing the third constant current source circuit 15 and the fourth constant current source circuit 16 in FIG. 9 that is the ninth embodiment are incorporated in the hysteresis comparator circuit.

Figure 11:
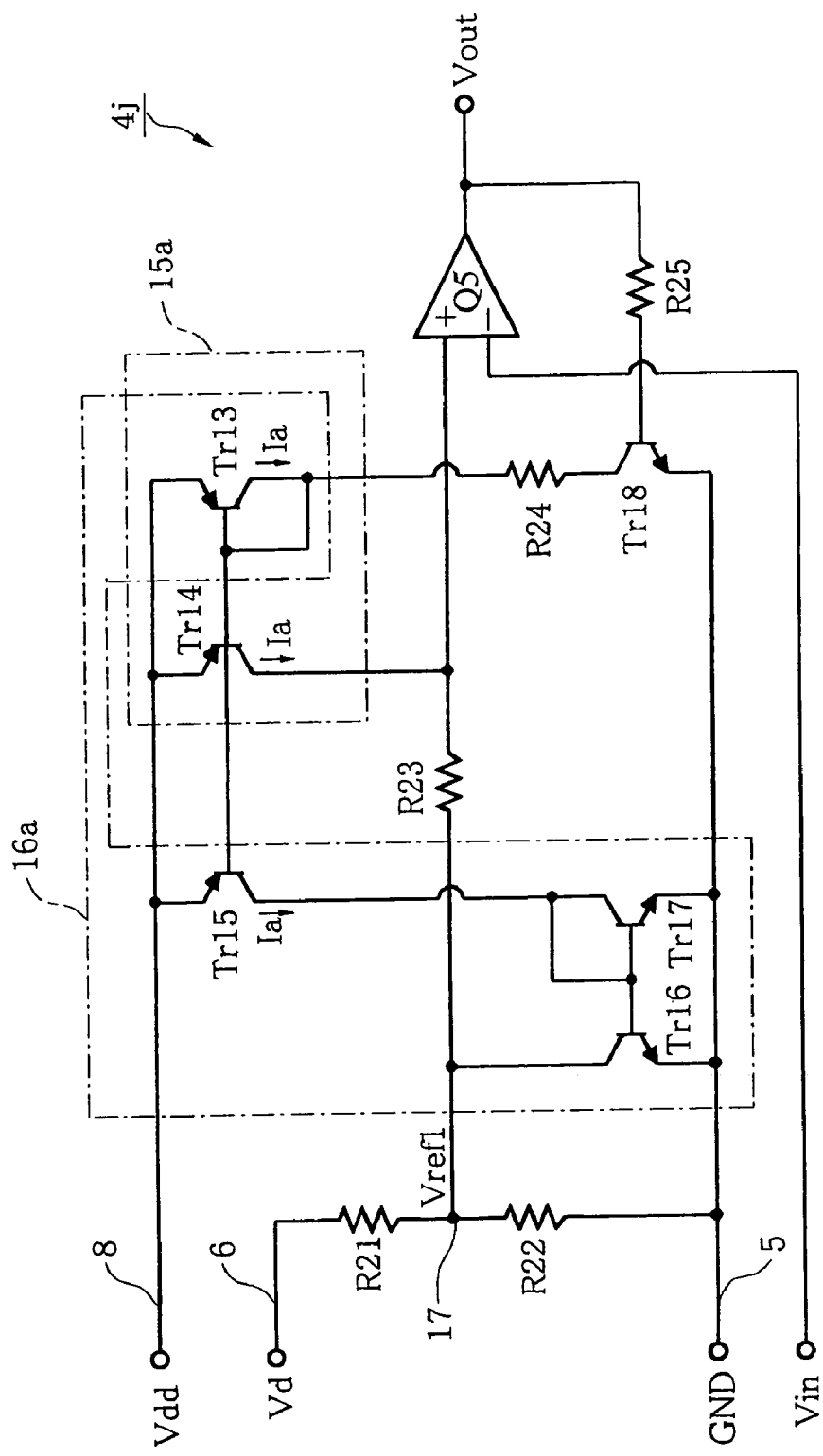
FIG. 11 is a hysteresis comparator circuit according to an eleventh embodiment of the present invention.

The first constant current source circuit 15 in FIG. 9 is replaced with a constant current source circuit 15a of a current mirror circuit configuration that includes a transistor (first PNP transistor) Tr13 and a transistor (second transistor) Tr14 in the circuit of this embodiment shown in FIG. 11. The emitters of the transistor Tr13 and the transistor Tr14 are connected together and connected to the second power line 8, and the bases thereof are connected together and connected to a collector of the transistor Tr13. A collector of the transistor Tr14 is connected to the non-inverting input terminal of the comparator Q5.

The transistor Tr13 and the transistor Tr14 are formed in such a manner that their electric characteristics are identical and the value of the current amplification factor may become large. Therefore, a current equal to the collector current of the transistor Tr13 flows out of the collector of the transistor Tr14 by the current mirror action.

The second constant current source circuit 16 in FIG. 9 is replaced with a constant current source circuit 16a constructed with a transistor (first PNP transistor) Tr13, a transistor (third PNP transistor) Tr15, a transistor (fourth NPN transistor) Tr16 and a transistor (fifth NPN transistor) Tr17 in the circuit of this embodiment shown in FIG. 11.

The transistor Tr15, together with the transistor Tr13, constitutes a current mirror circuit. The emitters of the transistor Tr15 and the transistor Tr13 are connected together and connected to the second power line 8, and the bases thereof are connected together and connected to the collector of the transistor Tr13. The collector of the transistor Tr15 is connected to a collector of the transistor Tr17.

The transistor Tr15 and the transistor Tr13 are formed in such a manner that their electric characteristics are identical and the value of the current amplification factor may become large. Therefore, a current equal to the collector current of the transistor Tr13 flows out of the collector of the transistor Tr15 by the current mirror action.

Moreover, the transistor Tr16 and the transistor Tr17 also form a current mirror circuit. Emitters of the transistor Tr16 and the transistor Tr17 are connected together and connected to the potential reference line 5, and the bases thereof are connected together and connected to the collector of the transistor Tr17. A collector of the transistor Tr16 is connected to the interconnection point 17, and the collector of the transistor Tr17 is connected to the collector of the transistor Tr15.

The transistor Tr16 and the transistor Tr17 are formed in such a manner that their electric characteristics are identical and the current amplification factor may become a large value. Therefore, a current equal to a collector current of the transistor Tr17 flows out of the collector of the transistor Tr16 by the current mirror action.

The current that flows into the collector of the transistor Tr17 is equal to a collector current of the transistor Tr15, and that current is equal to the collector current of the transistor Tr13. From this fact, the collector current of the transistor Tr16 becomes equal to the collector current of the transistor Tr13.

By these operations, a current supplied to the non-inverting input terminal of the comparator Q5 from the collector of the transistor Tr14 and a current that is absorbed by the collector of the transistor Tr16 from the interconnection point 17 become equal to the collector current Ia of the transistor Tr13.

The value of a collector current Ia of the transistor Tr13 is controlled by the resistor (fourth resistor) R24 connected in series between the collector of the transistor Tr13 and the potential reference line 5, and a transistor (eighth NPN transistor) Tr18. The emitter of the transistor Tr18 is connected to the potential reference line 5, and a resistor R25 is connected between the base thereof and the output terminal of the comparator Q5.

When the output voltage Vout of the comparator Q5 is the L level, the transistor Tr18 turns to the OFF state and the collector current of the transistor Tr13 becomes zero. At this time, collector currents of the transistors Tr14 and Tr16 are also zero; no current is supplied to the non-inverting input terminal of the comparator Q5 and no current is absorbed from the interconnection point 17. This state corresponds to the state where the output voltage Vout of the comparator Q5 is the L level in FIG. 9 of the ninth embodiment.

When the output voltage Vout of the comparator Q5 becomes the H level, the transistor Tr18 will turn to the ON state and the collector current Ia will flow in the transistor Tr13. The value of the collector current Ia becomes a constant value Ia obtained by the following calculation: a residual of subtraction of a base-emitter voltage of the transistor Tr13 from the value of the second constant voltage Vdd is divided by the resistance of the resistor R24.

At this time, the collector currents of the transistors Tr14 and Tr16 will also become the same constant current Ia; the current Ia will be supplied to the non-inverting input terminal of the comparator Q5 and the current Ia will be absorbed from the interconnection point 17. This state corresponds to the state where the output voltage Vout of the comparator Q5 is the H level in FIG. 9 of the ninth embodiment.

Thus, since the circuit operates in this way, the operations of the hysteresis comparator circuit 4j shown in FIG. 11 become the same as those of the hysteresis comparator circuit 4h shown in FIG. 9. The input-output characteristic becomes the one shown in FIG. 15, and this embodiment achieves the same advantage as was described in the ninth embodiment.

It is noted that, although the description was given assuming that the transistors Tr13, Tr14, and Tr15 have identical electric characteristics in this embodiment, as long as the Tr14 and Tr15 have the identical electric characteristics, the transistor Tr13 may differ from these transistors in cell area. In that case, the ratio of the collector currents of the transistors becomes the same as the ratio of the cell areas.

[Twelfth Embodiment]

Figure 10:
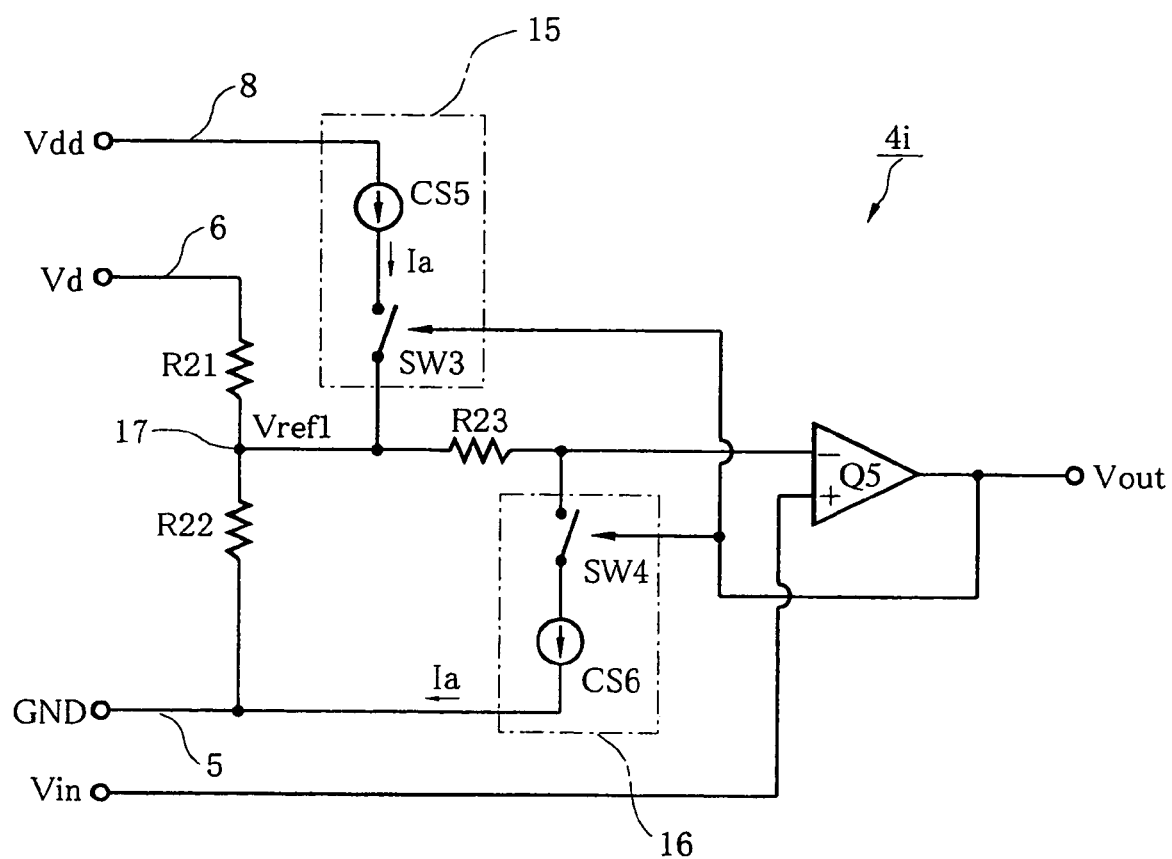
FIG. 10 is a hysteresis comparator circuit according to a tenth embodiment of the present invention.

A hysteresis comparator circuit 4k of a twelfth embodiment is an embodiment such that the first constant current source circuit 15 and the second constant current source circuit 16 of the hysteresis comparator circuit 4i in FIG. 10 that is the tenth embodiment are replaced with the constant current source circuit 15a and the constant current source circuit 16a adopted in FIG. 11 of the eleventh embodiment.

When the output voltage Vout of the comparator Q5 is the L level, the transistor Tr18 turns to the OFF state; the collector current of the transistor Tr13 becomes zero. At this time, the collector currents of the transistors Tr14 and Tr16 are also zero; no current is supplied to the interconnection point 17, and no current is absorbed from the non-inverting input terminal of the comparator Q5. This state corresponds to a state where the output voltage Vout of the comparator Q5 is the L level in FIG. 10 of the tenth embodiment.

When the output voltage Vout of the comparator Q5 becomes the H level, the transistor Tr18 will turn to the ON state and the collector current Ia will flow in the transistor Tr13. The value of the collector current Ia becomes a constant value Ia obtained by the following calculation: a residual of subtraction of the base-emitter voltage of the transistor Tr13 from the value of the second constant voltage Vdd is divided by the resistance of the resistor R24.

At this time, the collector currents of the transistors Tr14 and Tr 6 will become the same constant value Ia; the current Ia will be supplied to the interconnection point 17 and the current Ia will be absorbed from the non-inverting input terminal of the comparator Q5. This state corresponds to a state where the output voltage Vout of the comparator Q5 is the H level in FIG. 10 of the tenth embodiment.

Figure 12:
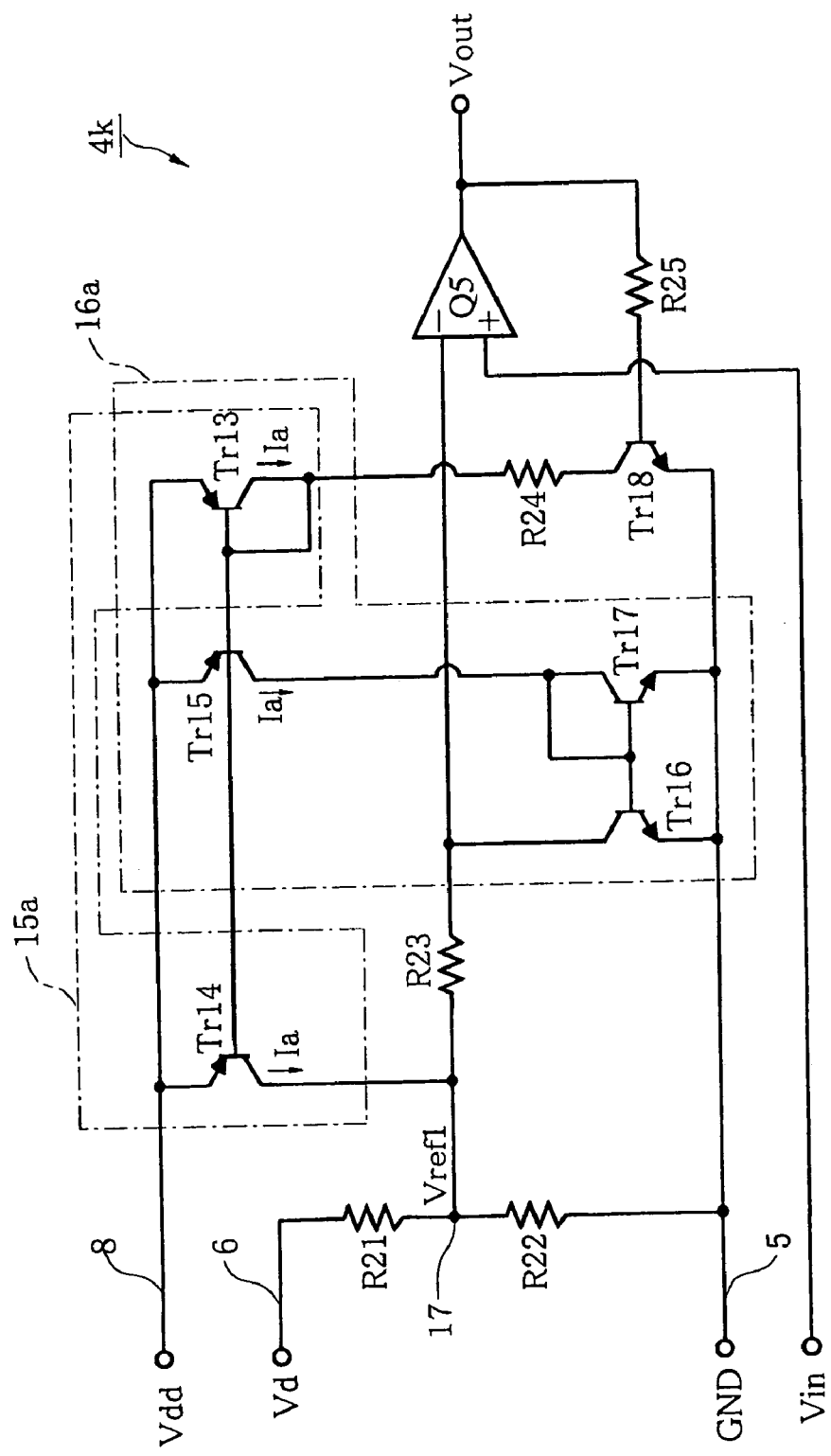
FIG. 12 is a hysteresis comparator circuit according to a twelfth embodiment of the present invention.

Since the circuit operates in this way, the operations of the hysteresis comparator circuit 4k shown in FIG. 12 become the same as those of the hysteresis comparator circuit 4j shown in FIG. 10. Its input-output characteristic becomes the one shown in FIG. 16. This circuit achieves the same advantage as that of the hysteresis comparator circuit 4j of the tenth embodiment.

The present invention is not limited to the disclosed embodiments, but may be implemented in many other ways without departing from the spirit of the invention.

What is claimed is:

1. A hysteresis comparator circuit comprising:
   a comparator that outputs a H-level voltage when a voltage applied to its non-inverting input terminal is equal to or larger than a voltage applied to its inverting input terminal, and outputs a L-level voltage when the above condition is not satisfied;
   first and second resistors connected in series between a potential reference line and a first power line for supplying a first constant voltage being set based on an electric potential of the potential reference line in this order, with the first resistor connected to the first power line;
   a third resistor connected between an interconnection point of the first and second resistors and the non-inverting input terminal of the comparator;
   a first constant current source circuit for supplying a predetermined constant current to the interconnection point only while the output voltage of the comparator is the L-level; and
   a second constant current source circuit for absorbing a constant current equal to the constant current supplied by the first constant current source circuit from the non-inverting input terminal of the comparator only while the output voltage of the comparator is the L-level,
   wherein an input voltage that is set based on the electric potential of the potential reference line is applied to the inverting input terminal of the comparator.

2. A hysteresis comparator circuit comprising:
   a comparator that outputs a H-level voltage when a voltage applied to its non-inverting input terminal is equal to or larger than a voltage applied to its inverting input terminal, and outputs a L-level voltage when the above condition is not satisfied;
   first and second resistors connected in series between a potential reference line and a first power line for supplying a first constant voltage being set based on an electric potential of the potential reference line in this order, with the first resistor connected to the first power line;
   a third resistor connected between an interconnection point of the first and second resistors and the inverting input terminal of the comparator;
   a first constant current source circuit for supplying a predetermined constant current to the inverting input terminal only while the output voltage of the comparator is the L-level; and
   a second constant current source circuit for absorbing a constant current equal to the constant current supplied by the first constant current source circuit from the connection point between the first resistor and the second resistor only while the output voltage of the comparator is the L-level,
   wherein an input voltage that is set based on the electric potential of the potential reference line is applied to the non-inverting input terminal of the comparator.

3. The hysteresis comparator circuit according to claim 1, wherein:
   the first constant current source circuit is constructed with a diode whose cathode is connected to the interconnection point of the first and second resistors, a first constant current source for always supplying a predetermined constant current to an anode of the diode, and a first NPN transistor that is connected between the anode of the diode and the potential reference line and is configured to be conductive only while the output voltage of the comparator is the H level; and
   the second constant current source circuit is constructed with a second NPN transistor connected between the non-inverting input terminal of the comparator and the potential reference line, a third NPN transistor whose base and corrector are connected to a base of the second NPN transistor and whose emitter is connected to the potential reference line, a second constant current source for always supplying a constant current of the same magnitude as that of the constant current outputted by the first constant current source to a collector of the third NPN transistor, and a fourth NPN transistor that is connected between the collector of the third NPN transistor and the potential reference line and configured to become conductive only while the output voltage of the comparator is the H level.

4. The hysteresis comparator circuit according to claim 2, wherein:
   the first constant current source circuit is constructed with a diode whose cathode is connected to the inverting input terminal of the comparator, a first constant current source for always supplying a predetermined constant current to an anode of the diode, and a first NPN transistor that is connected between the anode of the diode and the potential reference line and is configured to be conductive only while the output voltage of the comparator is the H level; and
   the second constant current source circuit is constructed with a second NPN transistor connected between the connection point of the first resistor and the second resistor and the potential reference line, a third NPN transistor whose base and corrector are connected to a base of the second NPN transistor and whose emitter is connected to the potential reference line, a second constant current source for always supplying a constant current of the same magnitude as that of the constant current outputted by the first constant current source to a collector of the third NPN transistor, and a fourth NPN transistor that is connected between the collector of the third NPN transistor and the potential reference line and configured to become conductive only while the output voltage of the comparator is the H level.

5. The hysteresis comparator circuit according to claim 3, wherein:

each of the first and second constant current sources is constructed as a constant current source circuit of a current mirror configuration that uses first and second PNP transistors having identical electric characteristics, a third PNP transistor, and a fourth resistor;

emitters of the first, second and third PNP transistors are all connected to a second power line that supplies a second constant voltage being set based on the electric potential of the potential reference line, bases thereof are connected together and connected to a collector of the third PNP transistor;

a collector of the first PNP transistor is connected to the anode of the diode, a collector of the second PNP transistor is connected to the collector of the third NPN transistor; and the fourth resistor is connected between the collector of the third PNP transistor and the potential reference line.

6. The hysteresis comparator circuit according to claim 4, wherein:

each of the first and second constant current sources is constructed as a constant current source circuit of a current mirror configuration that uses first and second PNP transistors having identical electric characteristics, a third PNP transistor, and a fourth resistor;

emitters of the first, second and third PNP transistors are all connected to a second power line that supplies a second constant voltage being set based on the electric potential of the potential reference line, bases thereof are connected together and connected to a collector of the third PNP transistor;

a collector of the first PNP transistor is connected to the anode of the diode, a collector of the second PNP transistor is connected to the collector of the third NPN transistor; and the fourth resistor is connected between the collector of the third PNP transistor and the potential reference line.

7. The hysteresis comparator circuit according to claim 3, wherein:

each of the first and second constant current sources is constructed as a constant current source circuit of a current mirror configuration that uses first and second PNP transistors having identical electric characteristics, a third PNP transistor, and a fourth resistor;

emitters of the first, second and third PNP transistors are all connected to a second power line that supplies a second constant voltage being set based on the electric potential of the potential reference line, bases thereof are connected together and connected to a collector of the third PNP transistor;

a collector of the first PNP transistor is connected to the anode of the diode, a collector of the second PNP transistor is connected to the collector of the third NPN transistor;

a fifth NPN transistor and a fifth resistor are connected in series between the collector of the third PNP transistor and the potential reference line, with the fifth resistor connected to the potential reference line; and a sixth resistor is connected between a base of the fifth NPN transistor and the second power line, a fourth PNP transistor is connected between the base thereof and the potential reference line, and a third constant voltage is applied to a base of the fourth PNP transistor.

8. The hysteresis comparator circuit according to claim 4, wherein:

each of the first and second constant current sources is constructed as a constant current source circuit of a current mirror configuration that uses first and second PNP transistors having identical electric characteristics, a third PNP transistor, and a fourth resistor;

emitters of the first, second and third PNP transistors are all connected to a second power line that supplies a second constant voltage being set based on the electric potential of the potential reference line, bases thereof are connected together and connected to a collector of the third PNP transistor;

a collector of the first PNP transistor is connected to the anode of the diode, a collector of the second PNP transistor is connected to the collector of the third NPN transistor;

a collector of the first PNP transistor is connected to the anode of the diode, a collector of the second PNP transistor is connected to the collector of the third NPN transistor;

a fifth NPN transistor and a fifth resistor are connected in series between the collector of the third PNP transistor and the potential reference line, with the fifth resistor connected to the potential reference line; and a sixth resistor is connected between a base of the fifth NPN transistor and the second power line, a fourth PNP transistor is connected between the base thereof and the potential reference line, and a third constant voltage is applied to a base of the fourth PNP transistor.

9. A hysteresis comparator circuit comprising:

a comparator that outputs a H-level voltage when a voltage applied to its non-inverting input terminal is equal to or more than a voltage applied to its inverting input terminal, and outputs a L-level voltage when the above condition is not satisfied;

first and second resistors connected in series between a potential reference line and a first power line for supplying a first constant voltage being set based on an electric potential of the potential reference line, with the first resistor connected to the first power line;

a third resistor connected between an interconnection point of the first and second resistors and the non-inverting input terminal of the comparator;

a first constant current source circuit for supplying a predetermined constant current to the non-inverting input terminal only while the output voltage of the comparator is the H-level; and a second constant current source circuit for absorbing a constant current equal to the constant current supplied by the first constant current source circuit from the interconnection point only while the output voltage of the comparator is the H-level, wherein an input voltage that is set based on the electric potential of the potential reference line is applied to the inverting input terminal of the comparator.

10. A hysteresis comparator circuit comprising:

a comparator that outputs a H-level voltage when a voltage applied to its non-inverting input terminal is equal to or more than a voltage applied to its inverting input terminal, and outputs a L-level voltage when the above condition is not satisfied;

first and second resistors connected in series between a potential reference line and a first power line for supplying a first constant voltage being set based on an electric potential of the potential reference line, with the first resistor connected to the first power line;

a third resistor connected between an interconnection point of the first and second resistors and the inverting input terminal of the comparator;

a first constant current source circuit for supplying a predetermined constant current to the connection point of the first resistor and the second resistor only while the output voltage of the comparator is the H-level; and a second constant current source circuit for absorbing a constant current equal to the constant current supplied by the first constant current source circuit from the inverting input terminal only while the output voltage of the comparator is the H-level, wherein an input voltage that is set based on the electric potential of the potential reference line is applied to the non-inverting input terminal of the comparator.

11. The hysteresis comparator circuit according to claim 9, wherein:

the first constant current source circuit is a constant current source circuit of a current mirror structure that includes first and second PNP transistors whose emitters are both connected to the second power line and whose bases are connected together;

the first constant current source circuit being configured so that a current proportional to the collector current of the first PNP transistor is made to output from a collector of the second PNP transistor; and wherein the second constant current source circuit is a constant current source circuit constructed with a current mirror circuit including a third PNP transistor having identical electric characteristics to those of the second PNP transistor and the first PNP transistor whose emitters are connected together and whose bases are connected together, the current mirror circuit being configured so that a current proportional to a collector current of the first PNP transistor is made to output from a collector of the third PNP transistor; and a current mirror circuit including the fourth and fifth NPN transistors having identical electric characteristics, whose emitters are both connected to the potential reference line and whose bases are both connected to a collector of the fifth NPN transistor, a collector of the fourth NPN transistor being connected to the interconnection point of the first and second resistors, and the collector of the fifth NPN transistor being connected to the collector of the third PNP transistor, the current mirror circuit being configured so that a current equal to a current flowing into the collector of the fifth NPN transistor is made to flow in the fourth NPN transistor;

the second constant current source circuit being configured so as to absorb a current proportional to the collector current of the first PNP transistor from the fourth NPN transistor; and the fourth resistor and the sixth NPN transistor are connected in series between the collector of the first PNP transistor and the potential reference line, with the fourth resistor connected to the collector, and the sixth NPN transistor becomes conductive only while the output voltage of the comparator is the H level.

12. The hysteresis comparator circuit according to claim 10, wherein:

the first constant current source circuit is a constant current source circuit of a current mirror structure that includes first and second PNP transistors whose emitters are both connected to the second power line and whose bases are connected together;

the first constant current source circuit being configured so that a current proportional to the collector current of the first PNP transistor is made to output from a collector of the second PNP transistor; and wherein the second constant current source circuit is a constant current source circuit constructed with a current mirror circuit including a third PNP transistor having identical electric characteristics to those of the second PNP transistor and the first PNP transistor whose emitters are connected together and whose bases are connected together, the current mirror circuit being configured so that a current proportional to a collector current of the first PNP transistor is made to output from a collector of the third PNP transistor; and a current mirror circuit including the fourth and fifth NPN transistors having identical electric characteristics, whose emitters are both connected to the potential reference line and whose bases are both connected to a collector of the fifth NPN transistor, a collector of the fourth NPN transistor being connected to the interconnection point of the first and second resistors, and the collector of the fifth NPN transistor being connected to the collector of the third PNP transistor, the current mirror circuit being configured so that a current equal to a current flowing into the collector of the fifth NPN transistor is made to flow in the fourth NPN transistor;

the second constant current source circuit being configured so as to absorb a current proportional to the collector current of the first PNP transistor from the fourth NPN transistor; and the fourth resistor and the sixth NPN transistor are connected in series between the collector of the first PNP transistor and the potential reference line, with the fourth resistor connected to the collector, and the sixth NPN transistor becomes conductive only while the output voltage of the comparator is the H level.

* * * * *